(12) United States Patent
Baek et al.

(10) Patent No.: US 11,438,535 B2
(45) Date of Patent: Sep. 6, 2022

(54) IMAGE SENSOR AND IMAGING DEVICE INCLUDING THE SAME

(71) Applicant: SAMSUNG ELECTRONICS CO., LTD., Suwon-si (KR)

(72) Inventors: Ingyu Baek, Seoul (KR); Seungsik Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 102 days.

(21) Appl. No.: 16/989,227

(22) Filed: Aug. 10, 2020

(65) Prior Publication Data

US 2021/0250529 A1     Aug. 12, 2021

(30) Foreign Application Priority Data

Feb. 12, 2020  (KR) .................. 10-2020-0016900

(51) Int. Cl.
| | |
|---|---|
| *H04N 5/359* | (2011.01) |
| *H04N 9/04* | (2006.01) |
| *H04N 5/378* | (2011.01) |
| *H01L 27/146* | (2006.01) |

(52) U.S. Cl.
CPC ............ *H04N 5/359* (2013.01); *H04N 5/378* (2013.01); *H04N 9/04515* (2018.08); *H04N 9/04551* (2018.08); *H01L 27/1463* (2013.01); *H01L 27/1464* (2013.01); *H01L 27/14603* (2013.01);
(Continued)

(58) Field of Classification Search
CPC .... H04N 5/359; H04N 5/378; H04N 9/04515; H04N 9/04551; H04N 5/35554; H04N 5/35563; H04N 5/37457; H04N 5/3765; H01L 27/14603; H01L 27/14621; H01L 27/14627; H01L 27/1463; H01L 27/1464; H01L 27/14645; H01L 27/14612; H01L 27/14643; H01L 27/14641; H01L 27/14609
See application file for complete search history.

(56) References Cited

U.S. PATENT DOCUMENTS

| | | | |
|---|---|---|---|
| 9,036,051 B2 | 5/2015 | Ahn et al. | |
| 9,137,472 B2* | 9/2015 | Minagawa | ......... H04N 5/37457 |
| 9,344,637 B2 | 5/2016 | Kasai et al. | |

(Continued)

FOREIGN PATENT DOCUMENTS

JP      2017-046020 A      3/2017

*Primary Examiner* — Nhan T Tran
(74) *Attorney, Agent, or Firm* — Volentine, Whitt & Francos, PLLC

(57) ABSTRACT

An imaging device includes a pixel array with first and second pixels respectively having first and second conversion gains connected to row and column lines; a row driver determining a selection row line among the row lines; a readout circuit obtaining first and second pixel signals from first and second pixels connected to the selection row line; a column driver generating first and second image data from the first and second pixel signals; and an image signal processor using the first and second image data to generate an object image. The second pixels include an expansion capacitor connected between a floating diffusion node and a ground node. Exposure time of the first pixels is equal to or longer than exposure time of the second pixels. An area of a light receiving region of the first pixels is equal to an area of a light receiving region of the second pixels.

18 Claims, 27 Drawing Sheets

(52) U.S. Cl.
CPC .. *H01L 27/14621* (2013.01); *H01L 27/14627* (2013.01); *H01L 27/14645* (2013.01)

(56) References Cited

U.S. PATENT DOCUMENTS

| | | |
|---|---|---|
| 9,467,633 B2 | 10/2016 | Johnson et al. |
| 9,848,141 B2* | 12/2017 | Panicacci ............. H04N 5/3745 |
| 10,015,416 B2 | 7/2018 | Borthakur et al. |
| 10,015,428 B2* | 7/2018 | Lee .................... H04N 5/37457 |
| 2017/0214878 A1 | 7/2017 | Van Der Tempel |
| 2018/0191974 A1* | 7/2018 | Shim ................. H04N 5/37457 |
| 2018/0343404 A1 | 11/2018 | Hwang et al. |
| 2020/0111831 A1 | 4/2020 | Choi et al. |
| 2020/0161352 A1* | 5/2020 | Takahashi ......... H01L 27/14623 |
| 2020/0389608 A1 | 12/2020 | Baek et al. |
| 2021/0144319 A1* | 5/2021 | Innocent ............. H04N 5/3559 |
| 2021/0175269 A1* | 6/2021 | Fujita ................ H04N 5/37455 |

\* cited by examiner

IMAGE SENSOR AND IMAGING DEVICE INCLUDING THE SAME

CROSS-REFERENCE TO RELATED APPLICATION(S)

A claim of priority under 35 U.S.C. § 119 is made to Korean Patent Application No. 10-2020-0016900 filed on Feb. 12, 2020 in the Korean Intellectual Property Office, the entirety of which is hereby incorporated by reference.

BACKGROUND

The present disclosure relates to image sensors and imaging devices including the same.

Image sensors receive light and generate electric signals responsive thereto, and may be made of semiconductor material. As the computer and communications industries continue to advance, there has become an increasing demand for image sensors having improved performance. Such semiconductor-based image sensors may include for example charge coupled device (CCD) image sensors and complementary metal-oxide-semiconductor (CMOS) image sensors. Among CCD image sensors and CMOS image sensors, the driving methods of CMOS image sensors are typically straightforward and simple. Also, CMOS image sensors include signal processing circuits that may be integrated into a single chip. Accordingly, since CMOS image sensors may be miniaturized, the use of CMOS image sensors is rapidly increasing. Recently, there has been interest in various methods for improving noise characteristics, dynamic range, and the like of image sensors.

SUMMARY

Embodiments of the inventive concepts provide an image sensor having a high dynamic range (HDR) and an imaging device including the same.

Embodiments of the inventive concepts provide an imaging device including a pixel array connected to a plurality of row lines and a plurality of column lines, and including a plurality of first pixels having a first conversion gain and a plurality of second pixels having a second conversion gain, lower than the first conversion gain; a row driver determining a selection row line from among the plurality of row lines; a readout circuit respectively obtaining a first pixel signal and a second pixel signal from first pixels and second pixels connected to the selection row line; a column driver generating first image data from the first pixel signal and second image data from the second pixel signal; and an image signal processor generating an object image from the first image data and the second image data. Each of the second pixels includes a floating diffusion n ode, a ground node, and an expansion capacitor connected between the floating diffusion node and the ground node. The row driver sets exposure time of the first pixels to be equal to or longer than exposure time of the second pixels. An area of a light receiving region of each of the first pixels is equal to an area of a light receiving region of each of the second pixels.

Embodiments of the inventive concepts further provide an imaging device including a pixel array including a plurality of color pixel groups, wherein each of the plurality of color pixel groups including a plurality of first pixels and at least one second pixel; an image data generator that exposes the plurality of first pixels during a first exposure time to generate first image data, exposes the at least one second pixel during the first exposure time to generate second image data, and sequentially exposes the plurality of first pixels and the at least one second pixel during a second exposure time to generate third image data; and an image signal processor that merges the first image data, the second image data, and the third image data, to generate an object image. The image data generator generates the first image data by summing pixel signals obtained from the plurality of first pixels.

Embodiments of the inventive concepts still further provide an image sensor including a plurality of first pixels including a first floating diffusion region disposed in a substrate and a plurality of first photodiodes connected to the first floating diffusion region; at least one second pixel including a second floating diffusion region disposed in the substrate and at least one second photodiode connected to the second floating diffusion region, the second floating diffusion region is disposed adjacent to the first pixels in a direction parallel to an upper surface of the substrate; and an expansion capacitor disposed in the substrate and connected to the second floating diffusion region by a metal line. The expansion capacitor has a region overlapping at least one first pixel among the plurality of first pixels in a direction parallel to the upper surface of the substrate.

BRIEF DESCRIPTION OF DRAWINGS

The above and other aspects, features, and advantages of the inventive concepts will be more clearly understood from the following detailed description, taken in conjunction with the accompanying drawings, in which.

DETAILED DESCRIPTION

Figure 1:
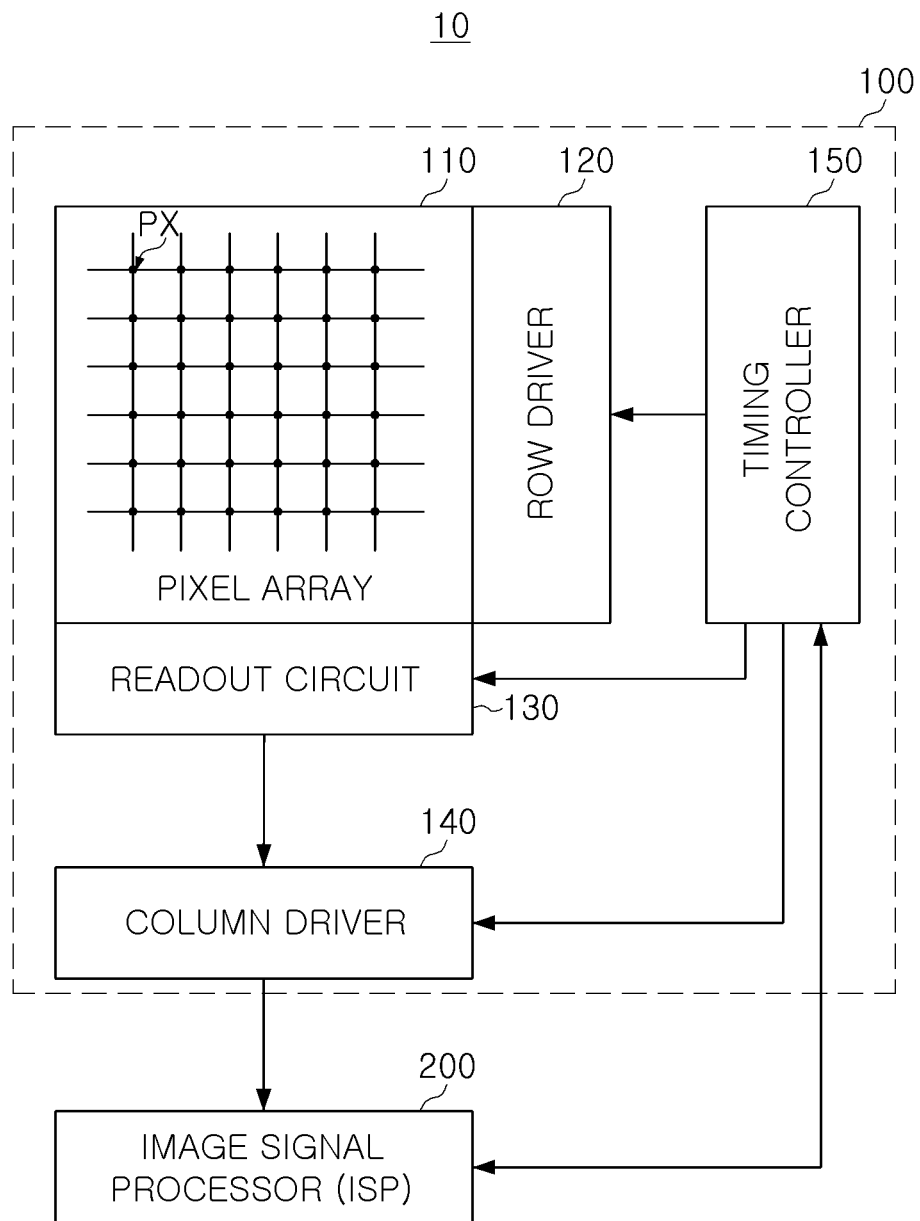
FIG. 1 illustrates a view of an imaging device according to embodiments of the inventive concepts.

Hereinafter, embodiments of the inventive concepts will be described in detail with reference to the accompanying drawings. The same reference numerals may be used for the same components in the drawings, and duplicate description of the same components may be omitted.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

FIG. 1 illustrates a view of an imaging device according to embodiments of the inventive concepts.

Referring to FIG. 1, an imaging device 10 may include an image sensor 100 and an image signal processor (ISP) 200.

The image sensor 100 may be implemented to detect an object to generate a pixel signal, and to use the generated pixel signal to generate an object image. The image sensor 100 may include a pixel array 110, a row driver 120, a readout circuit 130, a column driver 140, and a timing controller 150. The row driver 120, the readout circuit 130, the column driver 140, and the timing controller 150 as taken together may for example be characterized as an image data generator.

The pixel array 110 may include a plurality of pixels PX arranged in an array form along a plurality of row lines and a plurality of column lines.

Each of the plurality of pixels PX may include a photoelectric conversion element. For example, each of the plurality of pixels PX may include a photodiode generating charge in response to an optical signal incident from an external source, and a pixel circuit generating an electrical signal corresponding to the charge generated by the photodiode.

In addition, each of the plurality of pixels PX may include a pixel circuit for generating a pixel signal from the charge generated by the photodiode. The pixel circuit may include a floating diffusion (FD), a reset transistor, a driving transistor (source follower), a select transistor, and a transfer transistor.

The pixel circuit may obtain a pixel signal by detecting a reset voltage and a pixel voltage from each of the plurality of pixels PX and calculating a difference therebetween. The pixel signal may correspond to an amount of the charge generated by the photodiode included in each of the plurality of pixels PX.

The row driver 120 may drive the pixel array 110 in a row unit (e.g., by units of row). For example, the row driver 120 may generate a transmission control signal that controls the transfer transistor of the pixel circuit, a reset control signal that controls the reset transistor of the pixel circuit, and a selection control signal that controls the select transistor of the pixel circuit.

The readout circuit 130 may convert an analog pixel signal generated from the pixel array 110 into a digital signal, and may output the converted digital signal. The readout circuit 130 may include a sampling circuit and an analog-to-digital converter (ADC).

The sampling circuit may include a plurality of samplers such as correlated double samplers (CDS). The plurality of samplers may be connected through column lines to pixels connected to a row line selected by the row driver 120, and may detect a reset voltage and a pixel voltage from the pixels. In some examples, the plurality of samplers may compare each of the reset voltage and the pixel voltage with a predetermined ramp voltage, and may output the result of the comparison.

The analog-to-digital converter (ADC) may convert the pixel signal obtained from the reset voltage and the pixel voltage detected by the plurality of samplers into a digital signal, and may transfer the converted digital signal to the column driver 140.

The column driver 140 may include a latch or buffer circuit, an amplification circuit, and the like, and may temporarily store the digital signal. The column driver 140 may process the digital signal received from the readout circuit 130. For example, the column driver 140 may output image data corresponding to a column line selected from a plurality of column lines, among digital signals, to the image signal processor 200.

The timing controller 150 may control operation timing of the image sensor 100. For example, the timing controller 150 may control operation timing of the row driver 120, operation timing of the readout circuit 130, or operation timing of the column driver 140.

In an embodiment, the timing controller 150 may control the operation timing of the image sensor 100 differently according to an operation mode. For example, in a first operation mode, the timing controller 150 may control the row driver 120 such that a plurality of pixels are sequentially exposed. In the first operation mode, the timing controller 10 may automatically set exposure time of the plurality of pixels. In addition, in a second operation mode, the timing controller 150 may control the row driver 120 such that a pixel for high-illuminance and a pixel for low-illuminance are simultaneously exposed. Hereinafter, a pixel for high intensity of illumination may be defined as a high-illuminance pixel, and a pixel for low intensity of illumination may be defined as a low-illuminance pixel.

The low-illuminance pixel may refer to a pixel having a first conversion gain, and the high-illuminance pixel may refer to a pixel having a second conversion gain that is smaller than the first conversion gain. The high-illuminance pixel may include an expansion capacitor connected to a floating diffusion node. The expansion capacitance may expand (increase) the capacitance of the floating diffusion node of the high-illuminance pixel to be more or greater than the capacitance of a floating diffusion node of the low-illuminance pixel. Other than the expansion capacitor, the size and the characteristics of the low-illuminance pixel and the high-illuminance pixel may be the same. For example, an area of a light receiving region of the low-illuminance pixel may be the same as an area of a light receiving region of the high-illuminance pixel.

The image signal processor 200 may be implemented to process the image data output from the readout circuit 130. For example, the image signal processor 200 may perform signal processing operations such as for example color interpolation, color correction, gamma correction, color space conversion, edge correction, and the like on received frame data, to generate image data. The image signal processor 200 may process the image data to generate an object image, and may transmit the object image to a display or may store the object image in a memory. In an embodiment, the image signal processor 200 may merge first image data obtained from the low-illuminance pixel and second image data obtained from the high-illuminance pixel, to generate an object image.

An imaging device 10 according to an embodiment of the inventive concepts may simultaneously expose a low-illuminance pixel and a high-illuminance pixel to acquire low-illuminance image data and high-illuminance image data, and may merge the acquired low-illuminance image data and the acquired high-illuminance image data to generate an object image, to remove various noises and to secure a high dynamic range.

The plurality of pixels PX included in the pixel array 110 may be grouped by predetermined number to form a plurality of pixel groups. In an embodiment, the plurality of pixel groups may be color pixel groups having a red-green-green-blue (RGGB) pattern or a red-green-blue-white (RGBW) pattern.

Figure 2:
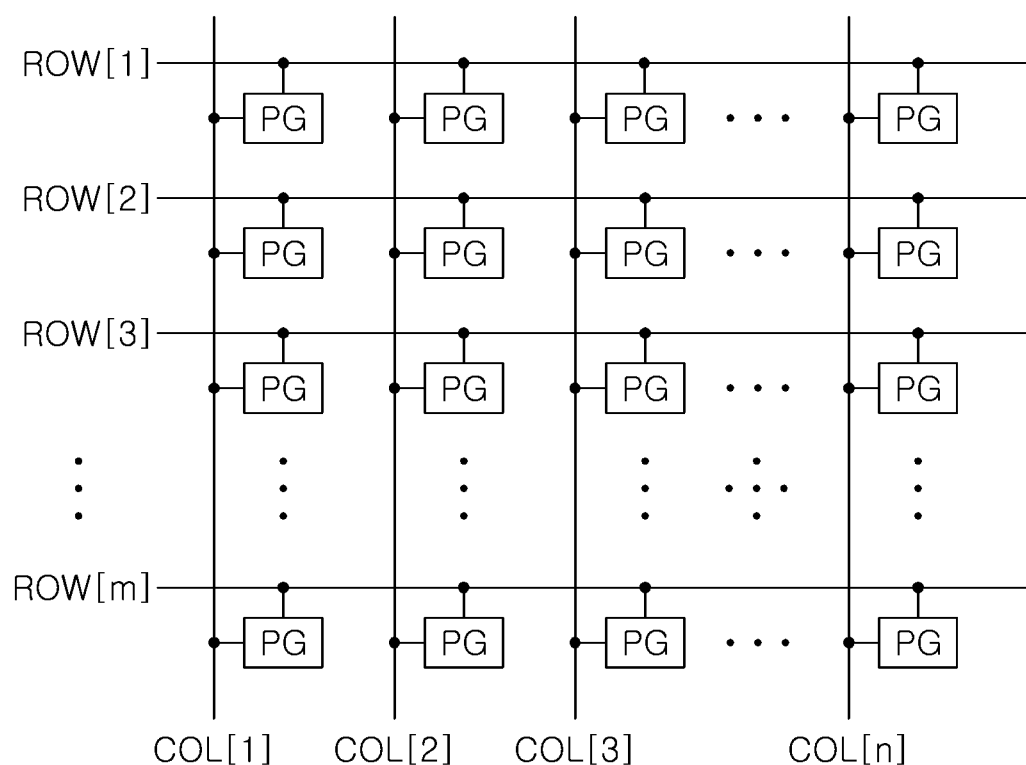
FIG. 2 illustrates a view of a pixel array of an image sensor according to embodiments of the inventive concepts.

FIG. 2 illustrates a view of a pixel array of an image sensor according to embodiments of the inventive concepts.

Referring to FIG. 2, a pixel array 200 may include a plurality of pixel groups PG connected to a plurality of row lines ROW[1] to ROW[m] and a plurality of column lines COL[1] to COL[n].

Each of the plurality of pixel groups PG may be implemented to obtain a different color image. In an embodiment, each of the plurality of pixel groups PG may include at least one color filter to pass specific wavelengths of light. For example, each of the plurality of pixel groups PG may include any one of a red color filter, a green color filter, or a blue color filter. Further, each of the plurality of pixel groups PG may include any one of a cyan filter, a yellow filter, or a magenta filter. As a result, the plurality of pixel groups PG may form a predetermined color pattern on the pixel array 200. Hereinafter, a structure of the pixel array 200 will be described in more detail with reference to FIGS. 3A to 4.

Figure 3A:
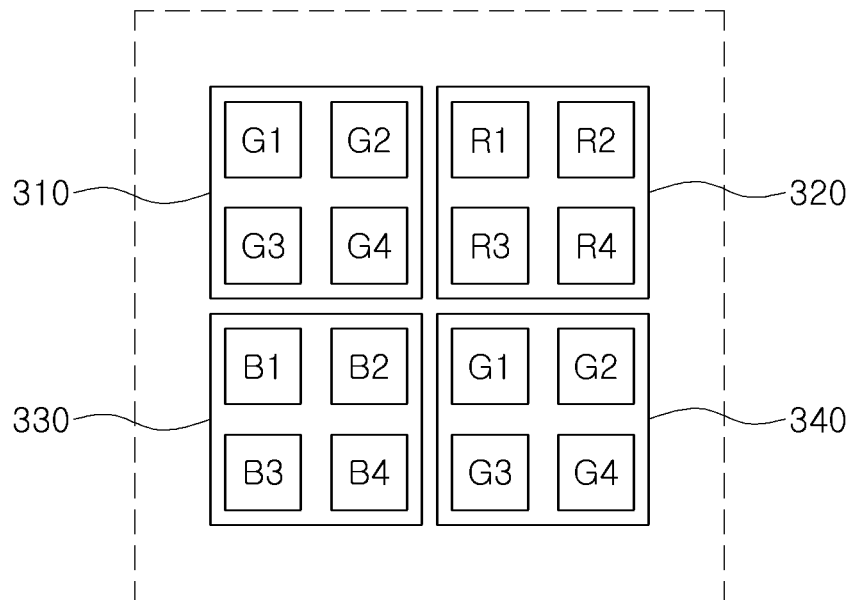
FIGS. 3A and 3B illustrate views respectively of pixel arrays of image sensors according to embodiments of the inventive concepts.
Figure 3B:
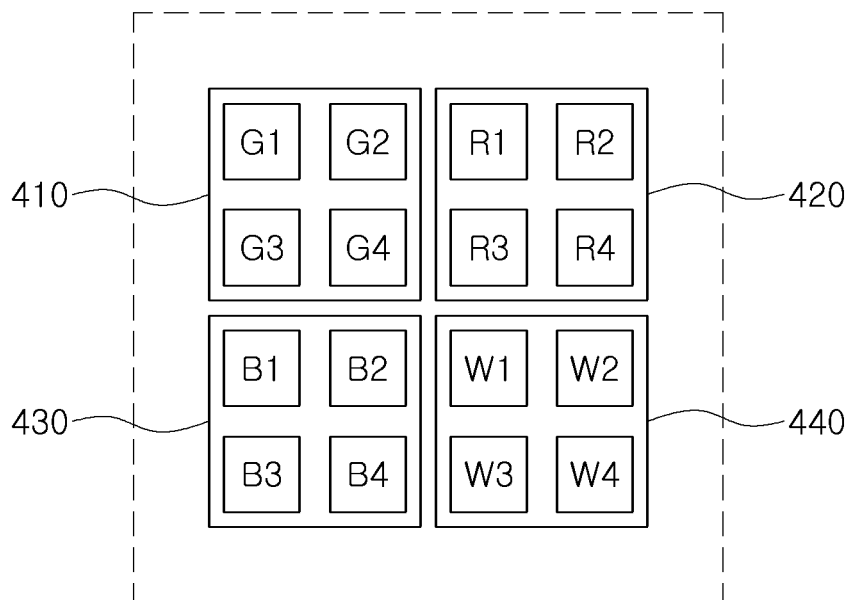
Figure 4:
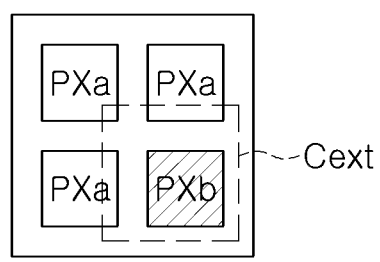
FIG. 4 illustrates a view of a pixel group that may be respectively included in the pixel arrays of FIGS. 3A and 3B.

FIGS. 3A and 3B illustrate views respectively of pixel arrays of image sensors according to embodiments of the inventive concepts. FIG. 4 illustrates a view of a pixel group that may be respectively included in the pixel arrays of FIGS. 3A and 3B.

Referring first to FIG. 3A, a red-green-green-blue (RGGB) pattern may be formed in a pixel array 300 by using first to fourth pixel groups 310 to 340 adjacent to each other. Each of the first and fourth pixel groups 310 and 340 may include a plurality of green color pixels G1 to G4, the second pixel group 320 may include a plurality of red color pixels R1 to R4, and the third pixel group 330 may include a plurality of blue color pixels B1 to B4. In FIG. 3A, each of the first to fourth pixel groups 310 to 340 may include four pixels adjacent to each other, but the number of pixels included in each of the pixel groups may be variously modified differently.

Each of the first and fourth pixel groups 310 and 340 may include at least one green color filter. The green color filter may be provided for each of the plurality of pixels G1 to G4, or at least a portion of the plurality of pixels G1 to G4 may be provided to share one green color filter.

The second pixel group 320 may include at least one red color filter. The red color filter may be provided for each of the plurality of pixels R1 to R4, or at least a portion of the plurality of pixels R1 to R4 may be provided to share one red color filter.

The third pixel group 330 may include at least one blue color filter. The blue color filter may be provided for each of the plurality of pixels B1 to B4, or at least a portion of the plurality of pixels B1 to B4 may be provided to share one blue color filter.

Specific pixel configurations of each of the first to fourth pixel groups 310 to 340 may be as illustrated in FIG. 4.

Referring to FIG. 4, a pixel group 500 may include four pixels (e.g., PXa and PXb) having a 2×2 matrix structure. In an embodiment, at least one pixel, among a plurality of pixels included in the pixel group 500, may be a high-illuminance pixel, and the remaining pixels thereof may be low-illuminance pixels. For example, as illustrated in FIG. 4, the pixel group 500 may include one high-illuminance pixel PXb and three low-illuminance pixels PXa.

Capacitance of a floating diffusion region of the high-illuminance pixel PXb may be larger than capacitance of a floating diffusion region of the low-illuminance pixel PXa, due to the high-illuminance pixel PXb including an expansion capacitor Cext. As a result, the high-illuminance pixel PXb such as shown in FIG. 4 may accumulate more charges than a low-illuminance pixel (e.g., any one of PXa in FIG. 4). Therefore, in a case that an image sensor operates in a high dynamic range (HDR) mode, since charge loss may be prevented even when exposure time of the high-illuminance pixel PXb is controlled to be the same as exposure time of the low-illuminance pixel PXa, image data having a relatively high resolution and a relatively high dynamic range may be acquired.

An expansion capacitor Cext may be disposed in a pixel circuit region of the high-illuminance pixel PXb. In an embodiment, the expansion capacitor Cext of the high-illuminance pixel PXb may overlap at least a portion of a low-illuminance pixel (e.g., any one of PXa in FIG. 4), on a plane parallel to a substrate.

In an embodiment, the expansion capacitor Cext may for example include a metal-insulator-metal (MIM) capacitor. The MIM capacitor may have a structure in which a dielectric film is disposed between an upper electrode and a lower electrode which are formed of a conductive material. In some examples, the dielectric film may include a material having a high dielectric constant. For example, the dielectric film may include AlN, BN, $Zr_3N_4$, $ZrO_2$, $HfO_2$, or the like.

In an embodiment, the expansion capacitor Cext may for example include a poly-insulator-poly (PIP) capacitor. The PIP capacitor may have a structure in which an oxide film is disposed between an upper polysilicon film and a lower polysilicon film. In some examples, the oxide film may be formed by oxidizing the lower polysilicon film.

In an embodiment, the expansion capacitor Cext may for example have capacitance of 1 fF or more and less than 1 pF. Depending on the capacitance, the expansion capacitor Cext may extend to the pixel circuit region of a low-illuminance pixel.

The high-illuminance pixel PXb may have the same size and characteristics as the low-illuminance pixel PXa, except that the high-illuminance pixel PXb further includes an expansion capacitor Cext connected to the floating diffusion region. For example, the area of the light receiving region of the high-illuminance pixel PXb may be the same as the area of the light receiving region of the low-illuminance pixel PXa. Since the image sensor may use pixels PXa and PXb having the same size and characteristics to generate image data, a dark current caused by a difference in size and characteristics for each pixel may be removed, and noise may be reduced.

As illustrated in FIGS. 3A and 4, a predetermined color pattern may be formed using four 2×2 pixel groups 500 including a total of 16 pixels in a pixel array, and such a pixel arrangement structure may be referred to as a tetra-structure. Alternatively, a predetermined color pattern may be formed using four 3×3 pixel groups including a total of 36 pixels in a pixel array, and such a pixel arrangement structure may be referred to as a nona-structure.

In other embodiments, a red-green-blue-white (RGBW) pattern may be formed in a pixel array instead of the red-green-green-blue (RGGB) pattern as shown in FIG. 3A.

Referring to FIG. 3B, an RGBW pattern may be formed in a pixel array 400 by using first to fourth pixel groups 410 to 440 adjacent to each other. The first pixel group 410 may include a plurality of green color pixels G1 to G4, and the second pixel group 420 may include a plurality of red color pixels R1 to R4. In addition, the third pixel group 430 may include a plurality of blue color pixels B1 to B4, and the fourth pixel group 440 may include a plurality of white color pixels W1 to W4. In FIG. 3B, each of the first to fourth pixel groups 410 to 440 may include four pixels adjacent to each other, but the number of pixels included in each of the pixel groups may be variously modified differently.

The first pixel group 410 may include at least one green color filter. The green color filter may be provided for each of the plurality of pixels G1 to G4, or at least a portion of the plurality of pixels G1 to G4 may be provided to share one green color filter.

The second pixel group 420 may include at least one red color filter. The red color filter may be provided for each of the plurality of pixels R1 to R4, or at least a portion of the plurality of pixels R1 to R4 may be provided to share one red color filter.

The third pixel group 430 may include at least one blue color filter. The blue color filter may be provided for each of the plurality of pixels B1 to B4, or at least a portion of the plurality of pixels B1 to B4 may be provided to share one blue color filter.

The fourth pixel group 440 may include at least one white color filter. The white color filter may be provided for each of the plurality of pixels W1 to W4, or at least a portion of the plurality of pixels W1 to W4 may be provided to share one white color filter.

Figure 5A:
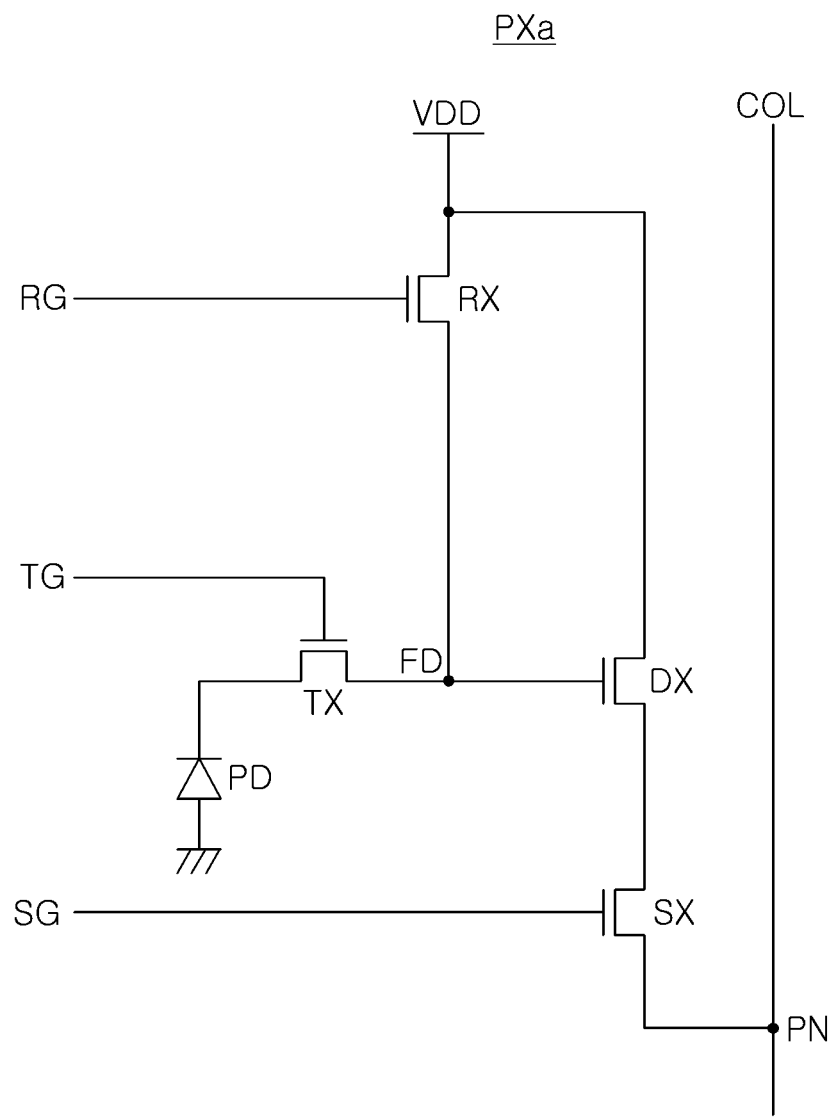
FIG. 5A illustrates a circuit diagram of a low-illuminance pixel of an image sensor according to an embodiments of the inventive concepts.
Figure 5B:
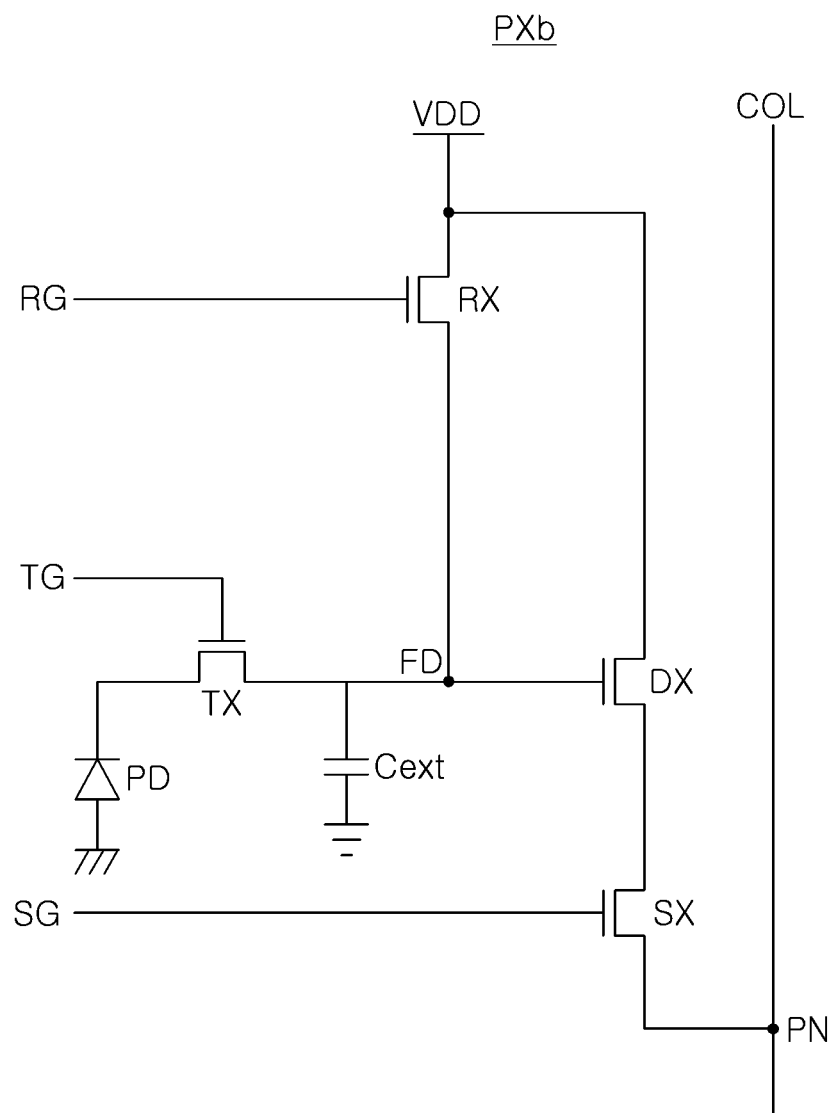
FIG. 5B illustrates a circuit diagram of a high-illuminance pixel of an image sensor according to embodiments of the inventive concepts.

FIG. 5A illustrates a circuit diagram of a low-illuminance pixel of an image sensor according to embodiments of the inventive concepts, and FIG. 5B illustrates a circuit diagram of a high-illuminance pixel of an image sensor according to embodiments of the inventive concepts.

Referring first to FIG. 5A, a low-illuminance pixel PXa may include a photodiode PD and a pixel circuit. The pixel circuit may include a floating diffusion FD, a reset transistor RX, a driving transistor DX, a select transistor SX, and a transfer transistor TX.

When an optical signal output from a light source is reflected from an object and is incident on a pixel array, the photodiode PD may generate charge in response to incident light. The charge generated by the photodiode PD may be stored in the floating diffusion FD.

When the reset transistor RX is turned on by a reset control signal RG, a voltage of the floating diffusion FD may be reset to a power supply voltage VDD. When the voltage of the floating diffusion FD is reset, the select transistor SX may be turned on by a selection control signal SG, to output a reset voltage to a column line COL through a pixel node PN.

When the transfer transistor TX is turned on by a transfer control signal TG after the reset voltage is output to the column line COL, a charge generated by the photodiode PD may move to the floating diffusion FD.

The driving transistor DX may operate as a source-follower amplifier that amplifies the voltage of the floating diffusion FD. When the select transistor SX is turned on by the selection control signal SG, a pixel signal corresponding to an amount of the charge generated by the photodiode PD may be output to the column line COL through the pixel node PN.

In some embodiments the low-illuminance pixel PXa may also include a plurality of photodiodes, instead of just a single photodiode PD as shown in FIG. 5A. The plurality of photodiodes may share a floating diffusion FD and a reset transistor RX. In addition, charges generated by the plurality of photodiodes may be accumulated in the floating diffusion FD. When a select transistor SX is turned on by a selection control signal SG, a pixel signal corresponding to the total amount of charge generated by the plurality of photodiodes may be output to a column line COL through a pixel node PN.

Referring to FIG. 5B, a high-illuminance pixel PXb may include a photodiode PD and a pixel circuit such as described with respect to FIG. 5A. Different than the low-illuminance pixel PXb of FIG. 5A, the high-illuminance pixel PXb may further include an expansion capacitor Cext. Since the high-illuminance pixel PXb has the same configuration and operation principle as the low-illuminance pixel PXa, except for further including an expansion capacitor Cext, a duplicate description of like configuration and operation will be omitted from the following description of FIG. 5B.

The expansion capacitor Cext in FIG. 5B may be connected between the floating diffusion FD node and a ground node to increase capacitance of the floating diffusion FD. In some embodiments, the expansion capacitor Cext may be a metal-insulator-metal (MIM) capacitor or a poly-insulator-poly (PIP) capacitor, and may have capacitance of 1 fF or more and less than 1 pF.

Figure 6A:
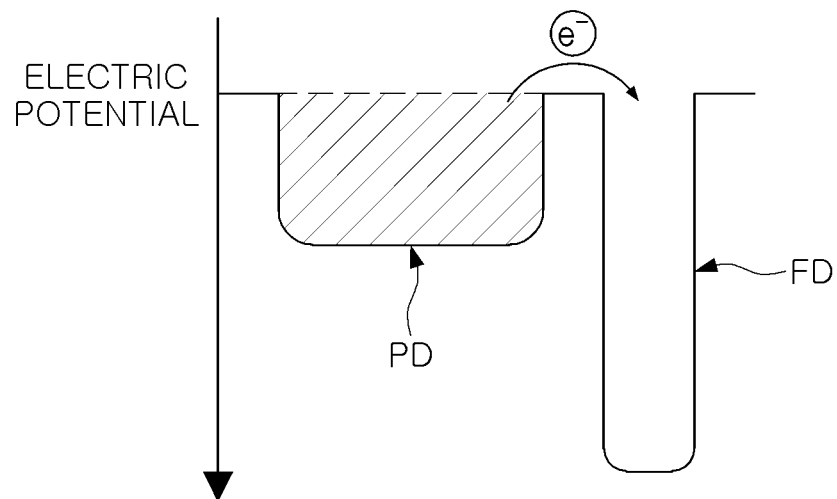
FIGS. 6A and 6B illustrate views respectively of a sampling operation of a low-illuminance pixel and a sampling operation of a high-illuminance pixel.
Figure 6B:
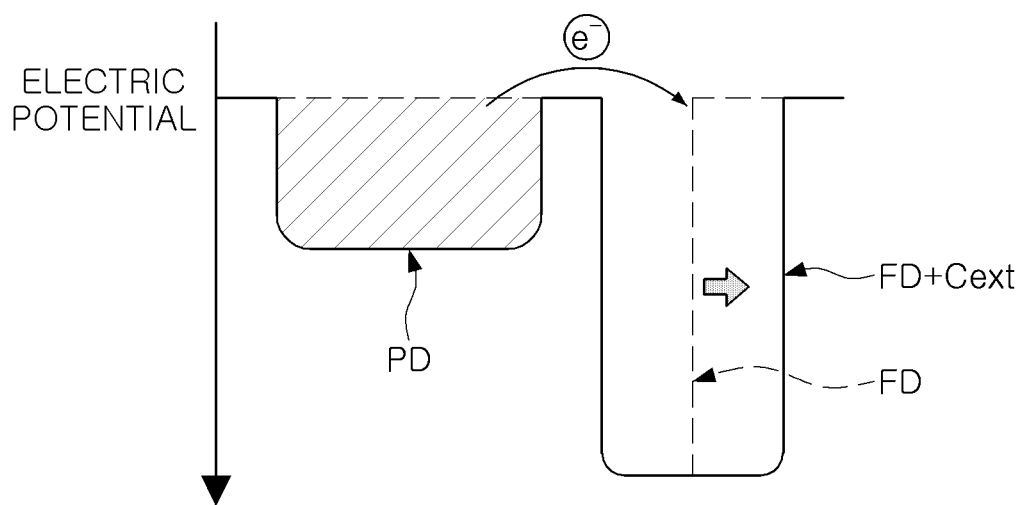

FIGS. 6A and 6B illustrate views respectively of a sampling operation of a low-illuminance pixel and a sampling operation of a high-illuminance pixel.

Referring first to FIG. 6A, charges $e^-$ overflowed from a photodiode PD may be generated in a high-illuminance environment. Since capacitance of a floating diffusion FD region of a low-illuminance pixel may be limited, when a low-illuminance pixel is used in a high-illuminance environment, charge loss may occur, and noise may occur in image data.

Referring to FIG. 6B, capacitance of a floating diffusion FD region of a high-illuminance pixel may be increased by an expansion capacitor Cext, as compared to the case of FIG. 6A which does not include an expansion capacitor. Therefore, even when charges $e^-$ overflowed from a photodiode PD may be generated in a high-illuminance environment, since the overflowed charges may be accommodated in the floating diffusion FD region, charge loss may not occur.

Due to these characteristics, an image sensor according to an embodiment of the inventive concepts may generate low-illuminance image data using low-illuminance pixels, may generate high-illuminance image data using low-illuminance pixels, and may merge the low-illuminance image data with the high-illuminance image data to generate an object image.

Figure 7:
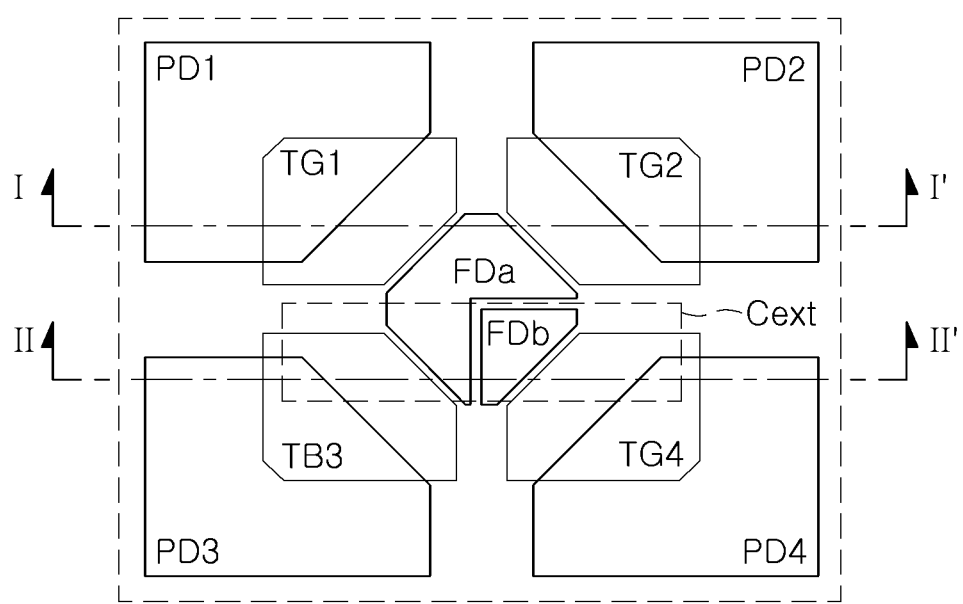
FIG. 7 illustrates a plan view of the pixel group of FIG. 4 according to embodiments of the inventive concepts.
Figure 8A:
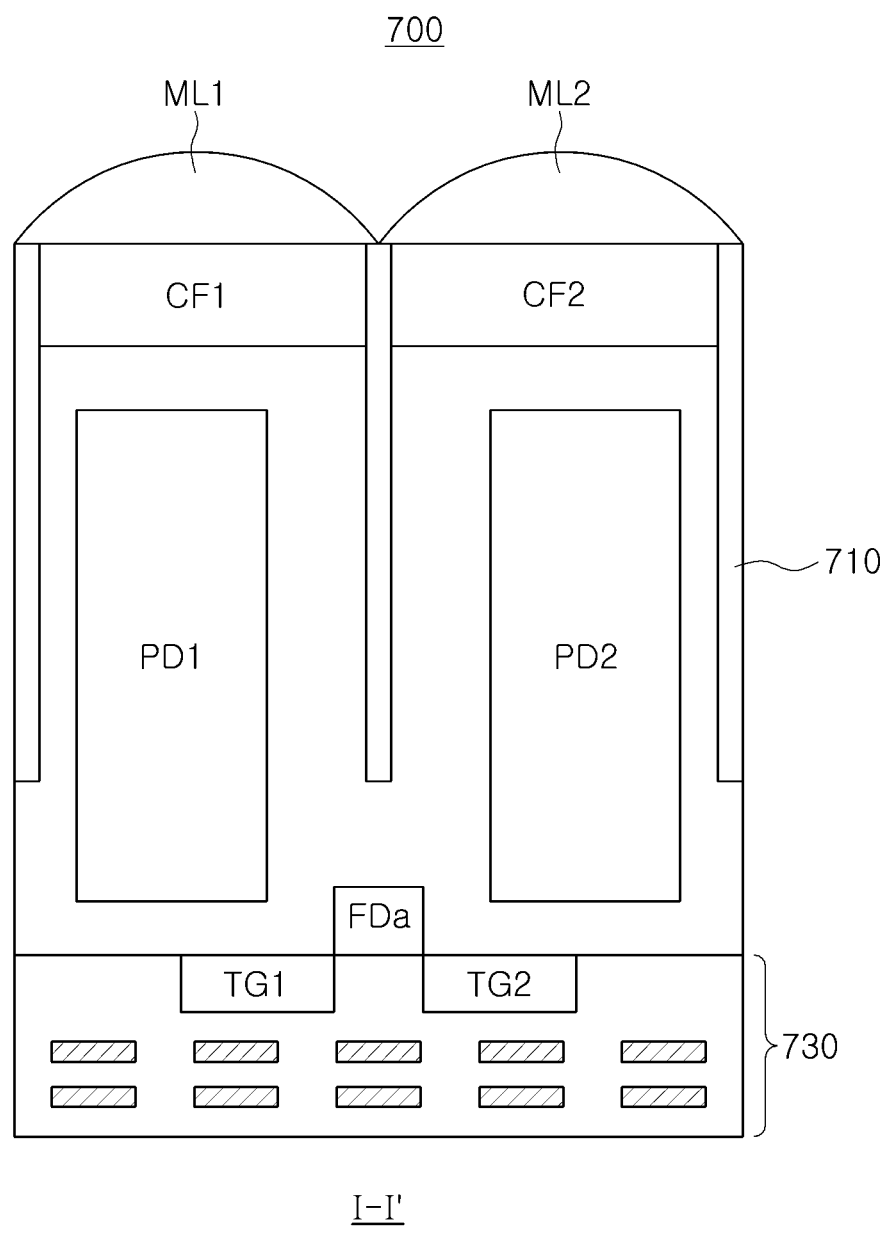
FIG. 8A illustrates a cross-sectional view taken along line I-I' of FIG. 7.
Figure 8B:
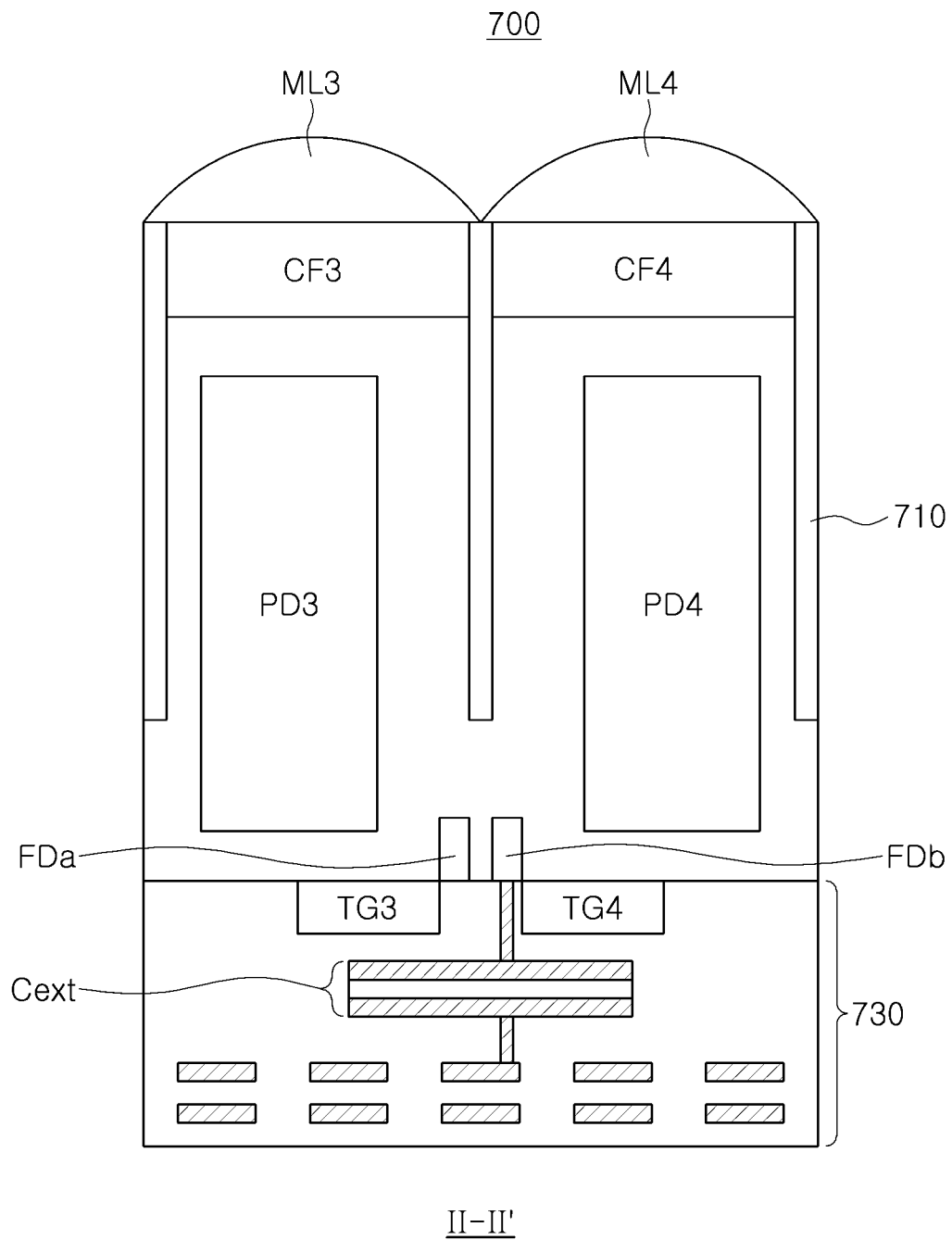
FIG. 8B illustrates a cross-sectional view taken along line II-II' of FIG. 7.

FIG. 7 illustrates a plan view of the pixel group of FIG. 4. FIG. 8A illustrates a cross-sectional view taken along line I-I' of FIG. 7, and FIG. 8B illustrates a cross-sectional view taken along line II-II' of FIG. 7.

Referring first to FIG. 7, a pixel group 700 may include first to fourth photodiodes PD1 to PD4, first to fourth transfer gate electrodes TG1 to TG4, and first and second floating diffusion regions FDa and FDb.

The first transfer gate electrode TG1 may be a gate electrode of a first transfer transistor connected to the first photodiode PD1, and the second transfer gate electrode TG2 may be a gate electrode of a second transfer transistor connected to the second photodiode PD2. In addition, the third transfer gate electrode TG3 may be a gate electrode of a third transfer transistor connected to the third photodiode PD3, and the fourth transfer gate electrode TG4 may be a gate electrode of a fourth transfer transistor connected to the fourth photodiode PD4.

The first to fourth photodiodes PD1 to PD4 may configure different pixels. In an embodiment, the first to third photodiodes PD1 to PD3 may constitute low-illuminance pixels, and the fourth photodiode PD4 may constitute a high-illuminance pixel.

In order to increase resolution of an image sensor, a size and full well capacitance of individual pixels may be decreased. The full well capacitance may be a performance index indicating a dynamic range of the image sensor. As the full well capacitance of individual pixels is decreased, a blurring phenomenon may occur, and thus an image quality of the image may deteriorate. In order to prevent deterioration of the image quality, the image sensor may share a floating diffusion region between adjacent pixels to secure an appropriate dynamic range.

The first to third photodiodes PD1 to PD3 constituting the low-illuminance pixel may be commonly connected to the first floating diffusion region FDa. For example, the first to third photodiodes PD1 to PD3 may share the first floating diffusion region FDa. The first to third photodiodes PD1 to PD3 may share the first floating diffusion region FDa, to combine pixel signals of each of the low-illuminance pixels at an analog stage.

Also, the fourth photodiode PD4 constituting the high-illuminance pixel may be connected to the second floating diffusion region FDb.

FIG. 7 illustrates the first and second floating diffusion regions FDa and FDb disposed at a center of the pixel group 700, but positions of the first and second floating diffusion regions FDa and FDb may be variously modified. For example, the floating diffusion region of each of the first to fourth photodiodes PD1 to PD4 may be disposed at a center of each of the first to fourth photodiodes PD1 to PD4. In this case, the floating diffusion region of each of the first to third photodiodes PD1 to PD4 may be connected to each other through a metal line.

An expansion capacitor Cext may be disposed below the fourth photodiode PD4. The expansion capacitor Cext may be connected to the second floating diffusion region FDb to increase capacitance of the second floating diffusion region FDb. In some embodiments, the expansion capacitor Cext may be a metal-insulator-metal (MIM) capacitor or a poly-insulator-poly (PIP) capacitor, and may have capacitance of 1 fF or more and less than 1 pF. In an embodiment, the expansion capacitor Cext may overlap at least a portion of the first to third photodiodes PD1 to PD3, on a plane parallel to a substrate.

The cross-section taken along line I-I' of FIG. 7 may be as illustrated in FIG. 8A.

Referring to FIG. 8A, a pixel group 700 may include a first photodiode PD1, a first color filter CF1 disposed on the first photodiode PD1, a second photodiode PD2, a second color filter CF2 disposed on the photodiode PD2, an element isolation layer 710, a pixel circuit region 730, and a first floating diffusion region FDa.

The element isolation layer 710 may electrically isolate a first pixel region including the first photodiode PD1 and a second pixel region including the second photodiode PD2. The element isolation layer 710 may electrically isolate the first pixel region and the second pixel region to prevent crosstalk due to optical interference. The element isolation layer 710 may extend from lower surfaces of micro-lenses ML1 and ML2 to be disposed between the plurality of pixel regions in a vertical direction.

The element isolation layer 710 may for example be formed using a trench process, a local-oxidation-of-silicon (LOCOS) process, or the like. When the element isolation layer 710 is formed by using a trench process, the element isolation layer 710 may have a deep-trench-isolation (DTI) structure or a shallow-trench-isolation (STI) structure. In an embodiment, the element isolation layer 710 may extend from the lower surfaces of the micro-lenses ML1 and ML2 to an upper surface of the pixel circuit region 730, to have a full-deep-trench-isolation (FDTI) structure fully isolating a plurality of pixel regions.

The pixel circuit region 730 may include a first transfer gate electrode TG1, a second transfer gate electrode TG2, and a plurality of metal lines.

When a first transfer transistor is turned on according to a control signal input to the first transfer gate electrode TG1, a charge generated by the first photodiode PD1 may move to the first floating diffusion region FDa. In addition, when a second transfer transistor is turned on according to a control signal input to the second transfer gate electrode TG2, a charge generated by the second photodiode PD2 may move to the first floating diffusion region FDa.

The first floating diffusion region FDa may store the charges generated by the first photodiode PD1 and the second photodiode PD2. For example, the charge generated by the first photodiode PD1 in a first pixel region and the charge generated by the second photodiode PD in a second pixel region, in response to an optical signal incident from an external source, may be stored in the first floating diffusion region FDa.

The first micro-lens ML1 may be disposed on the first color filter CF1, and the second micro-lens ML2 may be disposed on the second color filter CF2. The first micro-lens ML1 may focus an optical signal transmitted from an object onto the first photodiode PD1. In addition, the second micro-lens ML2 may focus an optical signal transmitted from an object onto the second photodiode PD2.

The first pixel region including the first photodiode PD1 and the second pixel region including the second photodiode PD2 may constitute different pixels. In an embodiment, the first pixel region and the second pixel region may constitute low-illuminance pixels, and may share a first floating diffusion region FDa. Also, the first pixel region and the second pixel region may constitute the same color pixel region. For example, when the first color filter CF1 and the second color filter CF2 are red color filters, the first pixel region and the second pixel region may constitute a red pixel.

FIG. 8A illustrates a case in which the color filters CF1 and CF2 and the micro-lenses ML1 and ML2 are provided on the first photodiode PD1 and the second photodiode PD2, respectively. However, upper structures of the first photodiode PD1 and the second photodiode PD2 may be modified in various ways. For example, one color filter and one micro-lens may be arranged on the first photodiode PD1 and the second photodiode PD2.

The cross-section taken along line II-II' of FIG. 7 may be as illustrated in FIG. 8B.

Referring to FIG. 8B, a pixel group 700 may include a third photodiode PD3, a third color filter CF3 disposed on the third photodiode PD3, a fourth photodiode PD4, a fourth color filter CF4 disposed on the fourth photodiode PD4, an element isolation layer 710, a pixel circuit region 730, a first floating diffusion region FDa, and a second floating diffusion region FDb. Hereinafter, differences between a vertical structure of the pixel group 700 in FIG. 8B and the vertical structure of the pixel group 700 in FIG. 8A will be described.

When a third transfer transistor is turned on according to a control signal input to a third transfer gate electrode TG3, a charge generated by the third photodiode PD3 may move to the first floating diffusion region FDa. Further, when a fourth transfer transistor is turned on according to a control signal input to a fourth transfer gate electrode TG4, a charge generated by the fourth photodiode PD4 may move to the second floating diffusion region FDb.

The first floating diffusion region FDa and the second floating diffusion region FDb may be arranged to be spaced apart from each other in a direction parallel to an upper surface of the pixel circuit region 730. The first floating diffusion region FDa and the second floating diffusion region FDb may be electrically isolated from each other. Therefore, the first floating diffusion region FDa may store the charge generated by the third photodiode PD3, and the second floating diffusion region FDb may store the charge generated by the fourth photodiode PD4. The first floating diffusion region FDa and the second floating diffusion region FDb do not share the charges respectively stored therein.

An expansion capacitor Cext may be connected to a lower portion of the second floating diffusion region FDb through a metal line. The expansion capacitor Cext may increase capacitance of the second floating diffusion region FDb. In embodiments, the expansion capacitor Cext may be a metal-insulator-metal (MIM) capacitor or a poly-insulator-poly (PIP) capacitor. In addition, the expansion capacitor Cext may have capacitance of 1 fF or more and less than 1 pF. FIG. 8B illustrates a case in which the extended capacitor Cext includes upper and lower electrodes and a dielectric layer stacked in a direction perpendicular to the upper surface of the pixel circuit region 730. However, in other embodiments a structure of the extended capacitor Cext may be modified in various ways. For example, the expansion capacitor Cext may include the upper and lower electrodes and the dielectric layer stacked in a direction parallel to the upper surface of the pixel circuit region 730.

A third micro-lens ML3 may be disposed on the third color filter CF3, and a fourth micro-lens ML4 may be disposed on the fourth color filter CF4. The third micro-lens ML3 may focus an optical signal transmitted from an object onto the third photodiode PD3. In addition, the fourth micro-lens ML4 may focus an optical signal transmitted from an object onto the fourth photodiode PD4.

The third pixel region including the third photodiode PD3 and the fourth pixel region including the fourth photodiode PD4 may constitute different pixels. In an embodiment, the third pixel region may constitute a low-illuminance pixel, and the fourth pixel region may constitute a high-illuminance pixel. Also, the third pixel region and the fourth pixel region may constitute the same color pixel region. For example, the third pixel region and the fourth pixel region may constitute a red pixel region. FIG. 8B illustrates a case in which the color filters CF3 and CF4 and the micro-lenses ML3 and ML4 are provided on the third photodiode PD3 and the fourth photodiode PD4, respectively. However, for example, in other embodiments the third photodiode PD3 and the fourth photodiode PD4 may share one color filter and one micro-lens disposed thereon.

Figure 9:
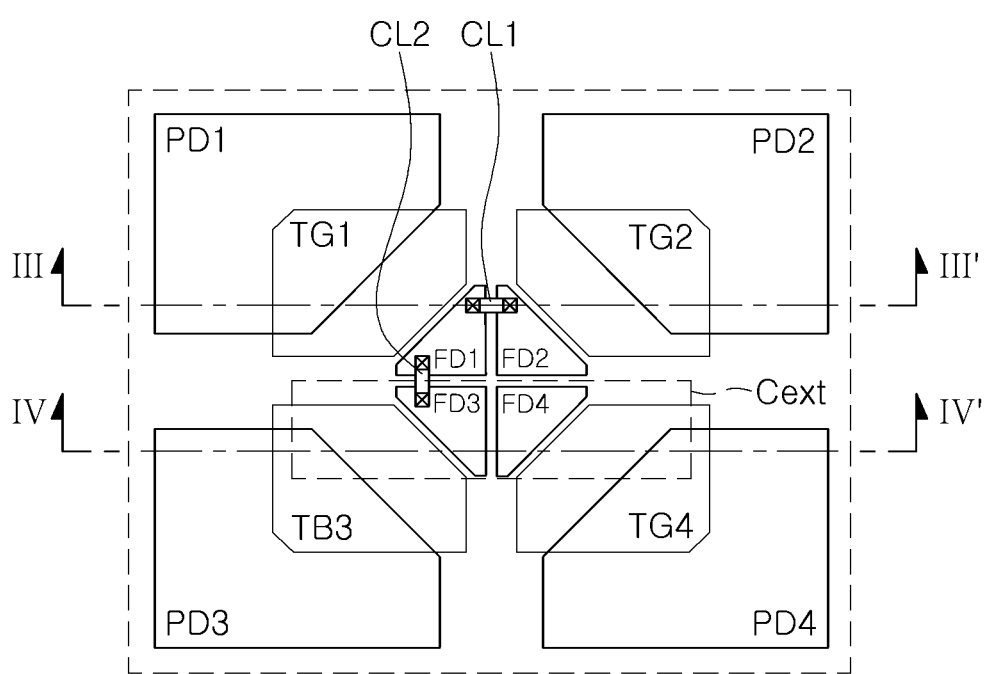
FIG. 9 illustrates a plan view of the pixel group of FIG. 4 according to embodiments of the inventive concepts.
Figure 10A:
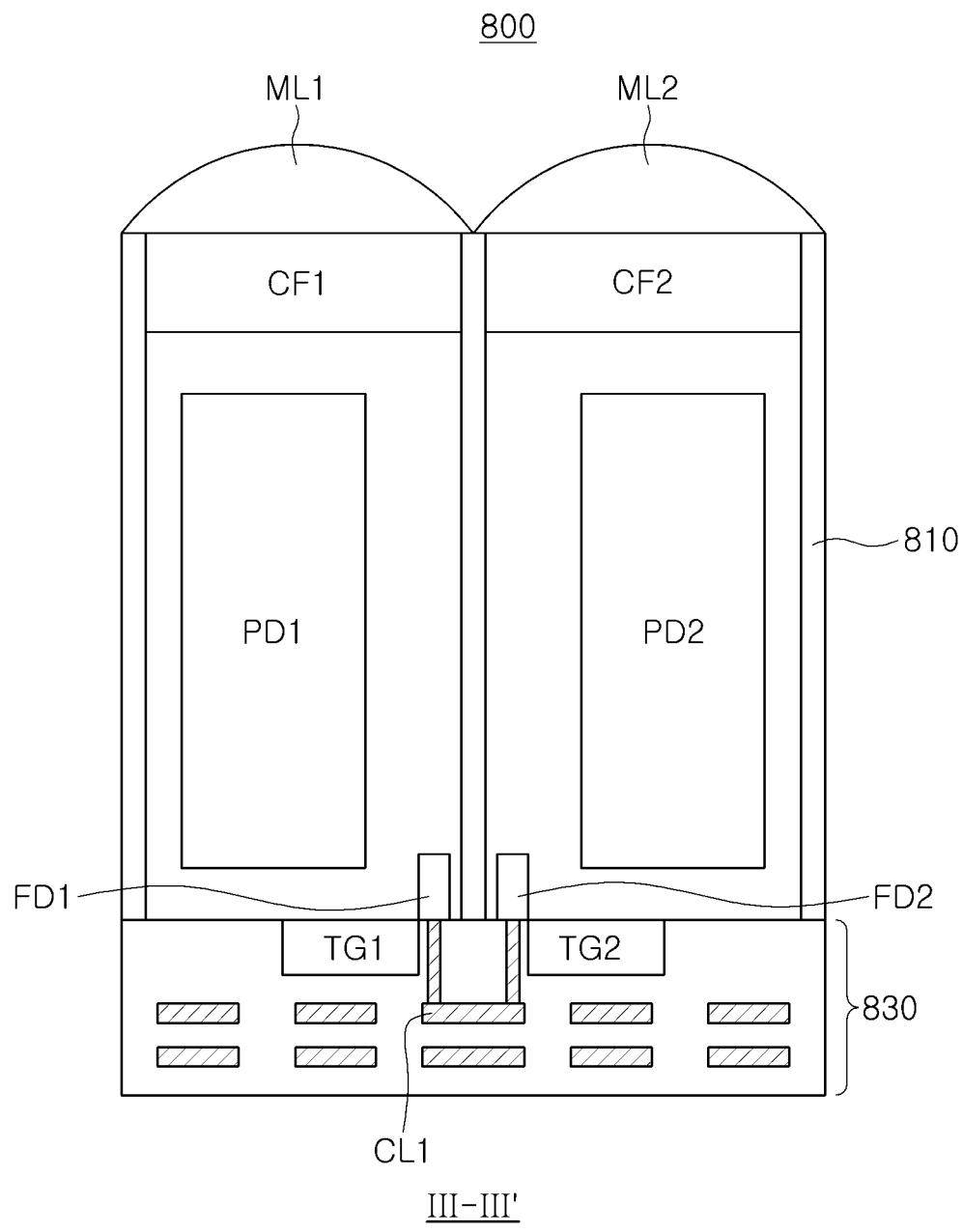
FIG. 10A illustrates a cross-sectional view taken along line of FIG. 9.
Figure 10B:
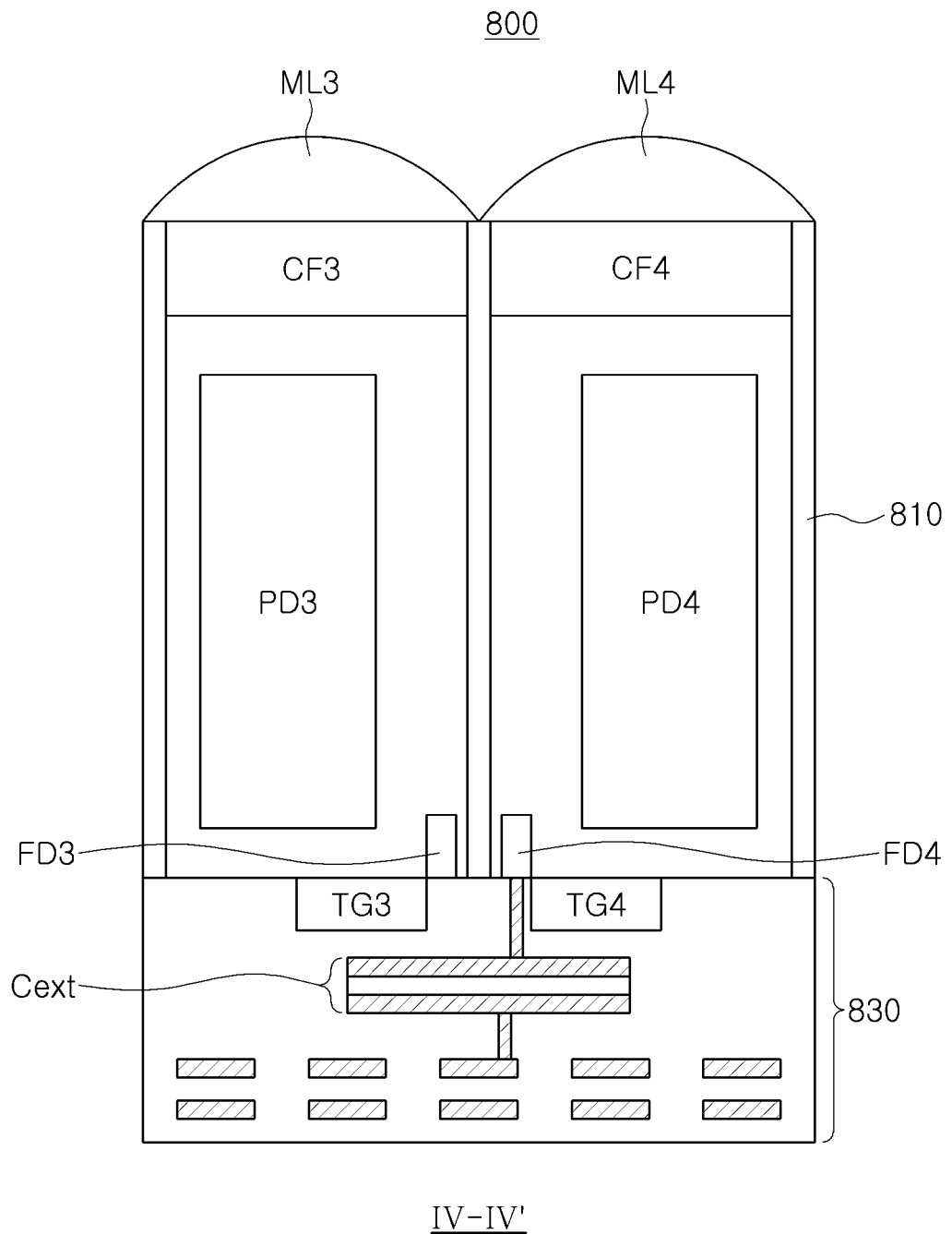
FIG. 10B illustrates a cross-sectional view taken along line IV-IV' of FIG. 9.

FIG. 9 illustrates a plan view of the pixel group of FIG. 4 according to embodiments of the inventive concepts. FIG. 10A illustrates a cross-sectional view taken along line III-III' of FIG. 9, and FIG. 10B illustrates a cross-sectional view taken along line IV-IV' of FIG. 9.

Referring first to FIG. 9, a pixel group 800 may include first to fourth photodiodes PD1 to PD4, first to fourth transfer gate electrodes TG1 to TG4, and first to fourth floating diffusion regions FD1 to FD4.

The first transfer gate electrode TG1 may be a gate electrode of a first transfer transistor connected to the first photodiode PD1, and the second transfer gate electrode TG2 may be a gate electrode of a second transfer transistor connected to the second photodiode PD2. In addition, the third transfer gate electrode TG3 may be a gate electrode of a third transfer transistor connected to the third photodiode PD3, and the fourth transfer gate electrode TG4 may be a gate electrode of a fourth transfer transistor connected to the fourth photodiode PD4.

The first to fourth photodiodes PD1 to PD4 may configure different pixels. In an embodiment, the first to third photodiodes PD1 to PD3 may constitute low-illuminance pixels, and the fourth photodiode PD4 may constitute a high-illuminance pixel.

The first to third floating diffusion regions FD1 to FD3 may be electrically connected by metal lines CL1 and CL2. As the first to third floating diffusion regions FD1 to FD3 may be electrically connected, the first to third photodiodes PD1 to PD3 constituting the low-illuminance pixel may share each of the floating diffusion regions FD1 to FD3.

The cross-section taken along line of FIG. 9 may be as illustrated in FIG. 10A.

Referring to FIG. 10A, the pixel group 800 may include a first photodiode PD1, a first color filter CF1 disposed on the first photodiode PD1, a second photodiode PD2, and a second color filter CF2 disposed on the second photodiode PD2, an element isolation layer 810, a pixel circuit region 830, a first floating diffusion region FD1, and a second floating diffusion region FD2.

The element isolation layer 810 may isolate a first pixel region including the first photodiode PD1 and a second pixel region including the second photodiode PD2, from each other. The element isolation layer 810 may extend from lower surfaces of micro-lenses ML1 and ML2 to an upper surface of the pixel circuit region 830. For example, the element isolation layer 810 may have a full-deep-trench-isolation (FDTI) structure. As the element isolation layer 810 has an FDTI structure, crosstalk due to optical interference between the first pixel region and the second pixel region may be completely prevented.

The first pixel region including the first photodiode PD1 and the second pixel region including the second photodiode PD2 may constitute different pixels. In an embodiment, the first pixel region and the second pixel region may constitute low-illuminance pixels.

The pixel circuit region 830 may include a first transfer gate electrode TG1, a second transfer gate electrode TG2, and a plurality of metal lines.

When a first transfer transistor is turned on according to a control signal input to the first transfer gate electrode TG1, a charge generated by the first photodiode PD1 may move to the first floating diffusion region FD1. Further, when a second transfer transistor is turned on according to a control signal input to the second transfer gate electrode TG2, a charge generated by the second photodiode PD2 may move to the second floating diffusion region FD2.

The first floating diffusion region FD1 and the second floating diffusion region FD2 may be electrically connected to each other through a metal line CL1. As the first floating diffusion region FD1 and the second floating diffusion region FD2 are electrically connected to each other, the first pixel region including the first photodiode PD1 and the second pixel region including the second photodiode PD2 may share the first floating diffusion region FD1 and the second floating diffusion region FD2. Therefore, a charge stored in the first floating diffusion region FD1 and a charge stored in the second floating diffusion region FD2 may be combined with each other to be used to generate one image data.

The first color filter CF1 and the first micro-lens ML1 may be sequentially disposed on the first photodiode PD1. In addition, the second color filter CF2 and the second micro-lens ML2 may be sequentially disposed on the second photodiode PD2. The first micro-lens ML1 may focus an optical signal transmitted from an object onto the first photodiode PD1, and the second micro-lens ML2 may focus an optical signal transmitted from an object onto the second photodiode PD2. The first color filter CF1 and the second color filter CF2 may pass only optical signals having the same wavelength. The first color filter CF1 and the second color filter CF2 may include any one of a red color filter, a green color filter, or a blue color filter.

The cross-section taken along line IV-IV' of FIG. 9 may be as illustrated in FIG. 10B.

Referring to FIG. 10B, the pixel group 800 may include a third photodiode PD3, a third color filter CF3 disposed on the third photodiode PD3, a fourth photodiode PD4, a fourth color filter CF4 disposed on the fourth photodiode PD4, an element isolation layer 810, a pixel circuit region 830, a third floating diffusion region FD3, and a fourth floating diffusion region FD4. Hereinafter, differences between a vertical structure of the pixel group 800 in FIG. 10B and the vertical structure 800 in FIG. 10A will be described.

The third pixel region including the third photodiode PD3 and the fourth pixel region including the fourth photodiode PD4 may constitute different pixels. In an embodiment, the third pixel region may constitute a low-illuminance pixel, and the fourth pixel region may constitute a high-illuminance pixel.

When a third transfer transistor is turned on according to a control signal input to a third transfer gate electrode TG3, a charge generated by the third photodiode PD3 may move to the third floating diffusion region FD3. In addition, when a fourth transfer transistor is turned on according to a control signal input to a fourth transfer gate electrode TG4, a charge generated by the fourth photodiode PD4 may move to the fourth floating diffusion region FD4.

The third floating diffusion region FD3 and the fourth floating diffusion region FD4 may be arranged to be spaced apart from each other in a direction parallel to an upper surface of the pixel circuit region 830. The third floating diffusion region FD3 and the fourth floating diffusion region FD4 may be electrically isolated from each other. Therefore, the third floating diffusion region FD3 may store the charge generated by the third photodiode PD3, the fourth floating diffusion region FD4 may store the charge generated by the fourth photodiode PD4, and the third floating diffusion region FD3 and the fourth floating diffusion region FD4 do not share the charges respectively stored therein.

An expansion capacitor Cext may be connected to a lower portion of the fourth floating diffusion region FD4 through a metal line. The expansion capacitor Cext may increase capacitance of the fourth floating diffusion region FD4. In an embodiment, the expansion capacitor Cext may be a metal-insulator-metal (MIM) capacitor or a poly-insulator-poly (PIP) capacitor. In addition, the expansion capacitor Cext may have capacitance of 1 fF or more and less than 1 pF.

The third color filter CF3 and a third micro-lens ML3 may be sequentially disposed on the third photodiode PD3. In addition, the fourth color filter CF4 and a fourth micro-lens ML4 may be sequentially disposed on the fourth photodiode PD4. The third micro-lens ML3 may focus an optical signal transmitted from an object onto the third photodiode PD3. In addition, the fourth micro-lens ML4 may focus an optical signal transmitted from an object onto the fourth photodiode PD4.

Figure 11:
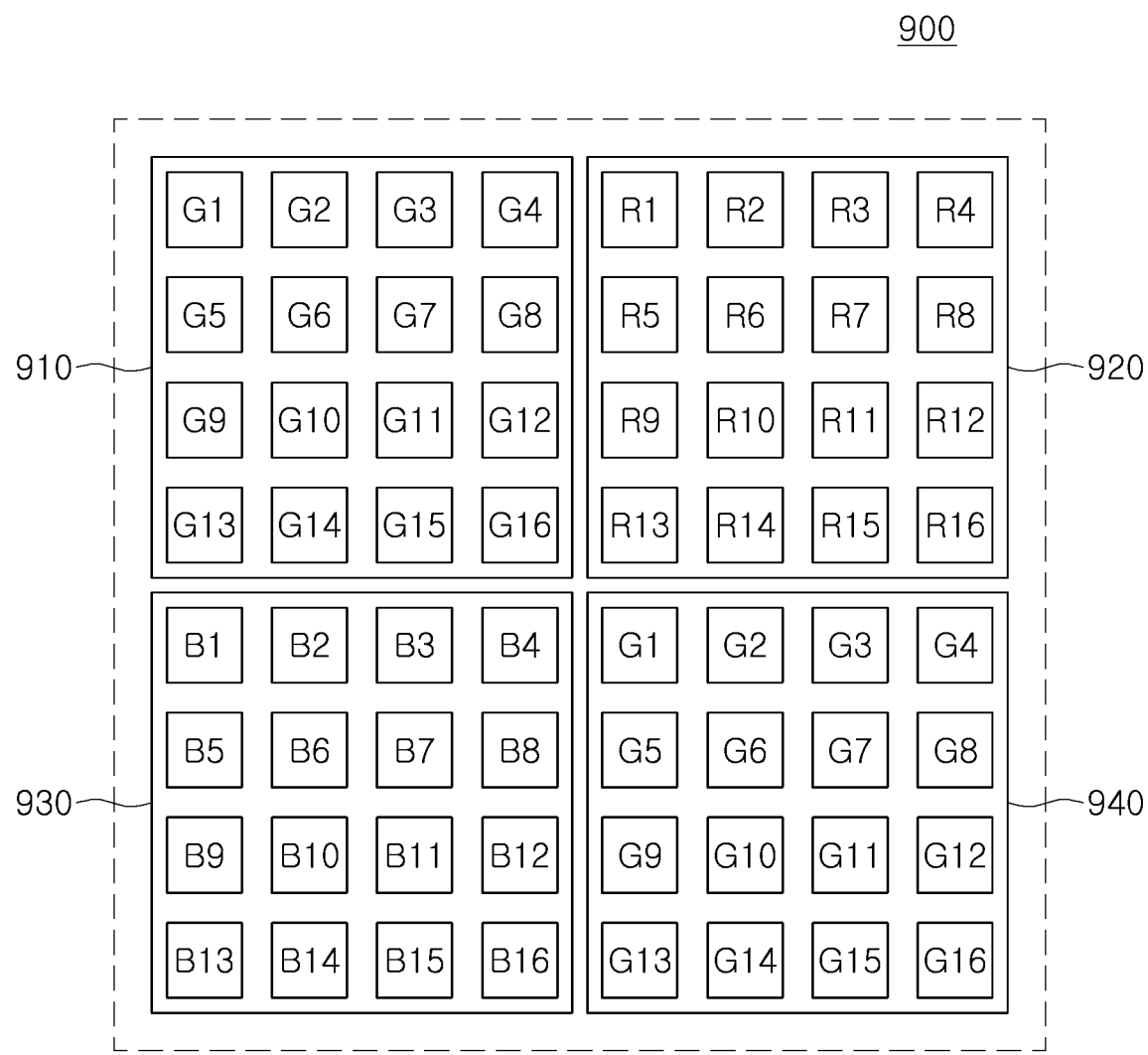
FIG. 11 illustrates a view of a pixel array of an image sensor according to embodiments of the inventive concepts.
Figure 12:
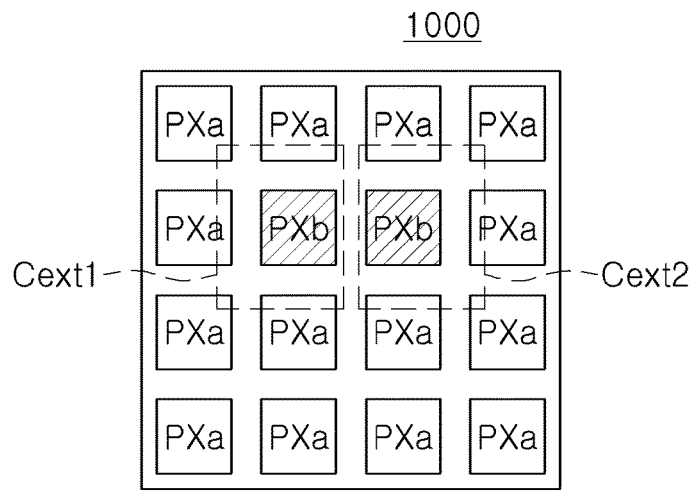
FIG. 12 illustrates a view of a pixel group that may be included in the pixel array of FIG. 11.

FIG. 11 illustrates a view of a pixel array of an image sensor according to embodiments of the inventive concepts. FIG. 12 illustrates a view of a pixel group that may be included in the pixel array of FIG. 11.

Referring first to FIG. 11, a pixel array 900 of an image sensor according to embodiments of the inventive concepts may include a plurality of pixels having an N×M matrix structure (where, N and M are positive integers). The plurality of pixels of the pixel array 900 may form a plurality of pixel groups to form a predetermined color pattern. For example, a red-green-green-blue (RGGB) pattern may be formed in the pixel array 900 using first to fourth pixel groups 910 to 940. FIG. 11 illustrates that the pixel array 900 has an 8×8 matrix structure and includes four pixel groups 910 to 940 each consisting of 16 pixels, however in other embodiments a pixel structure of the pixel array 900 may be variously modified.

Each of the first and fourth pixel groups 910 and 940 may include at least one green color filter. The green color filter may be provided for each pixel G1 to G16, or at least a portion of the plurality of pixels G1 to G16 may be provided to share one green color filter.

The second pixel group 920 may include at least one red color filter. The red color filter may be provided for each pixel R1 to R16, or at least a portion of the plurality of pixels R1 to R16 may be provided to share one red color filter.

The third pixel group 930 may include at least one blue color filter. The blue color filter may be provided for each pixel B1 to B16, or at least a portion of the plurality of pixels B1 to B16 may be provided to share one blue color filter.

A specific pixel configuration of each of the first to fourth pixel groups 910 to 940 may be as illustrated in FIG. 12.

Referring to FIG. 12, a pixel group 1000 may include 16 pixels PXa and PXb having a 4×4 matrix structure. In an embodiment, at least one pixel, among a plurality of pixels included in the pixel group 1000, may be a high-illuminance pixel, and remaining pixels thereof may be low-illuminance pixels. For example, the pixel group 1000 may include two high-illuminance pixels PXb and 14 low-illuminance pixels PXa.

In other embodiments, the number of high-illuminance pixels PXb included in the pixel group 1000 may be variously changed according to dynamic range requirements of an imaging device. For example, in order to make a dynamic range corresponding to the high-illuminance pixel PXb larger than a dynamic range corresponding to the low-illuminance pixel PXa, the number of high-illuminance pixels PXb included in the pixel group 1000 may be appropriately adjusted.

Different than the low-illuminance pixels PXa, in FIG. 12 the high-illuminance pixels PXb as shown may further include expansion capacitors Cext1 and Cext2. Therefore, the high-illuminance pixels PXb may have a floating diffusion region having capacitance greater than capacitance of the floating diffusion regions of the low-illuminance pixels PXa. Therefore, in a case that an image sensor operates in a high dynamic range (HDR) mode, since charge loss may be prevented even when exposure time of the high-illuminance pixels PXb is controlled to be the same as exposure time of the low-illuminance pixels PXa, image data having a relatively high resolution and a relatively high dynamic range may be acquired.

The expansion capacitors Cext1 and Cext2 may be disposed in pixel circuit regions of the high-illuminance pixels PXb. In an embodiment, the expansion capacitors Cext1 and Cext2 may extend in a direction parallel to a substrate, to partially overlap the low-illuminance pixels PXa. In an embodiment, the expansion capacitors Cext1 and Cext2 may include a metal-insulator-metal (MIM) capacitor, or a poly-insulator-poly (PIP) capacitor. Further, the expansion capacitors Cext1 and Cext2 may have capacitance of 1 fF or more and less than 1 pF.

The high-illuminance pixels PXb may have the same size and characteristics as the low-illuminance pixels PXa, except that the high-illuminance pixels PXb further include the expansion capacitors Cext1 and Cext2 connected to the floating diffusion region. For example, an area of a light receiving region of the high-illuminance pixels PXb may be the same as an area of a light receiving region of the low-illuminance pixels PXa. Since the image sensor may use the plurality of pixels PXa and PXb having the same size and characteristics to generate image data, a dark current caused by a difference in size and characteristics for each of the plurality of pixels may be removed, and noise may be reduced.

Although FIG. 12 illustrates that the high-illuminance pixels PXb are disposed adjacent to a center of the pixel group 1000, in order to increase light-receiving efficiency of the high-illuminance pixels PXb, a position of the high-illuminance pixels PXb may be variously modified. For example, the high-illuminance pixels PXb may be disposed at a position spaced a predetermined distance from the center of the pixel group 1000 (e.g., an edge region of the pixel group 1000).

Figure 13:
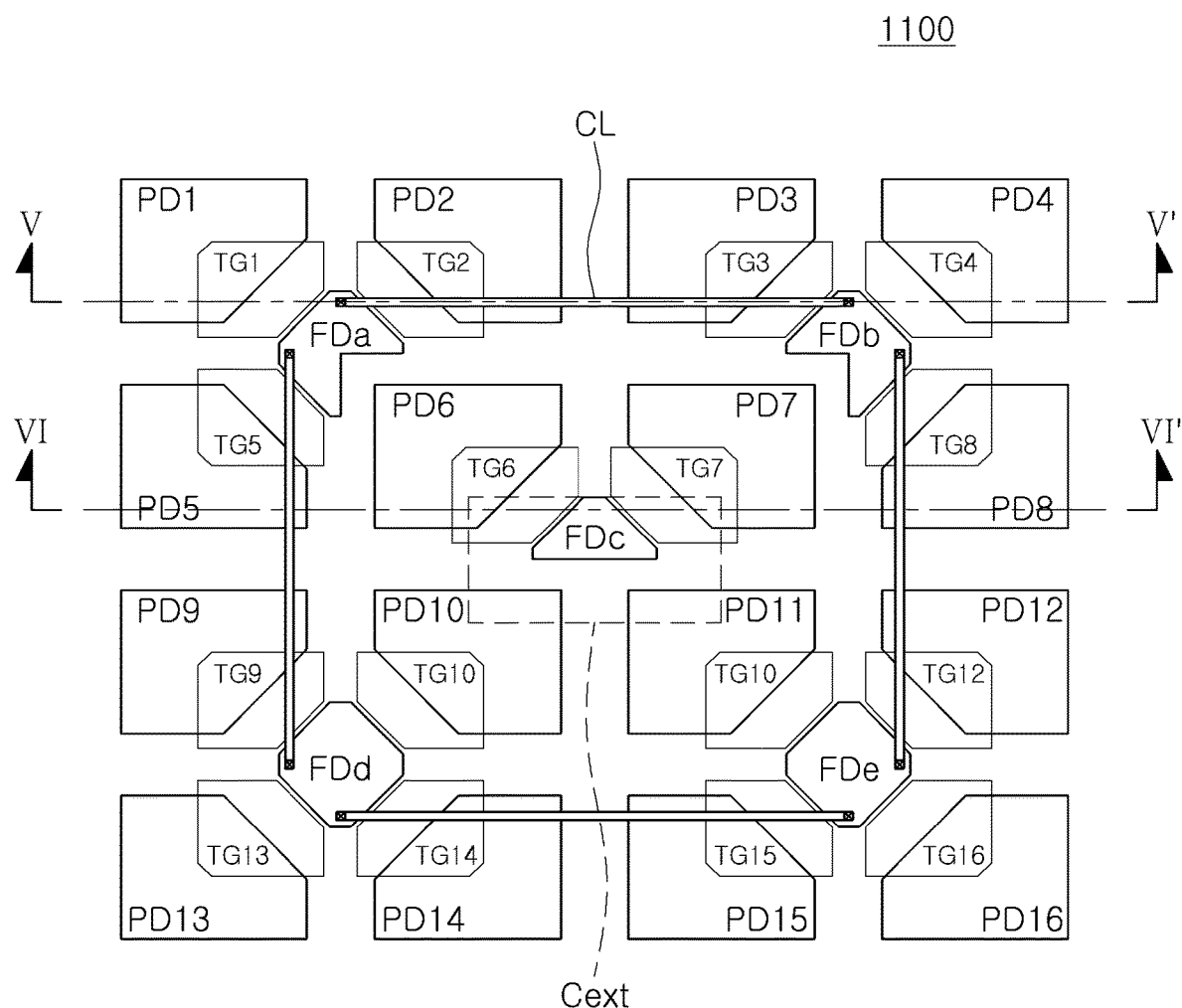
FIG. 13 illustrates a plan view of the pixel group of FIG. 12 according to embodiments of the inventive concepts.
Figure 14A:
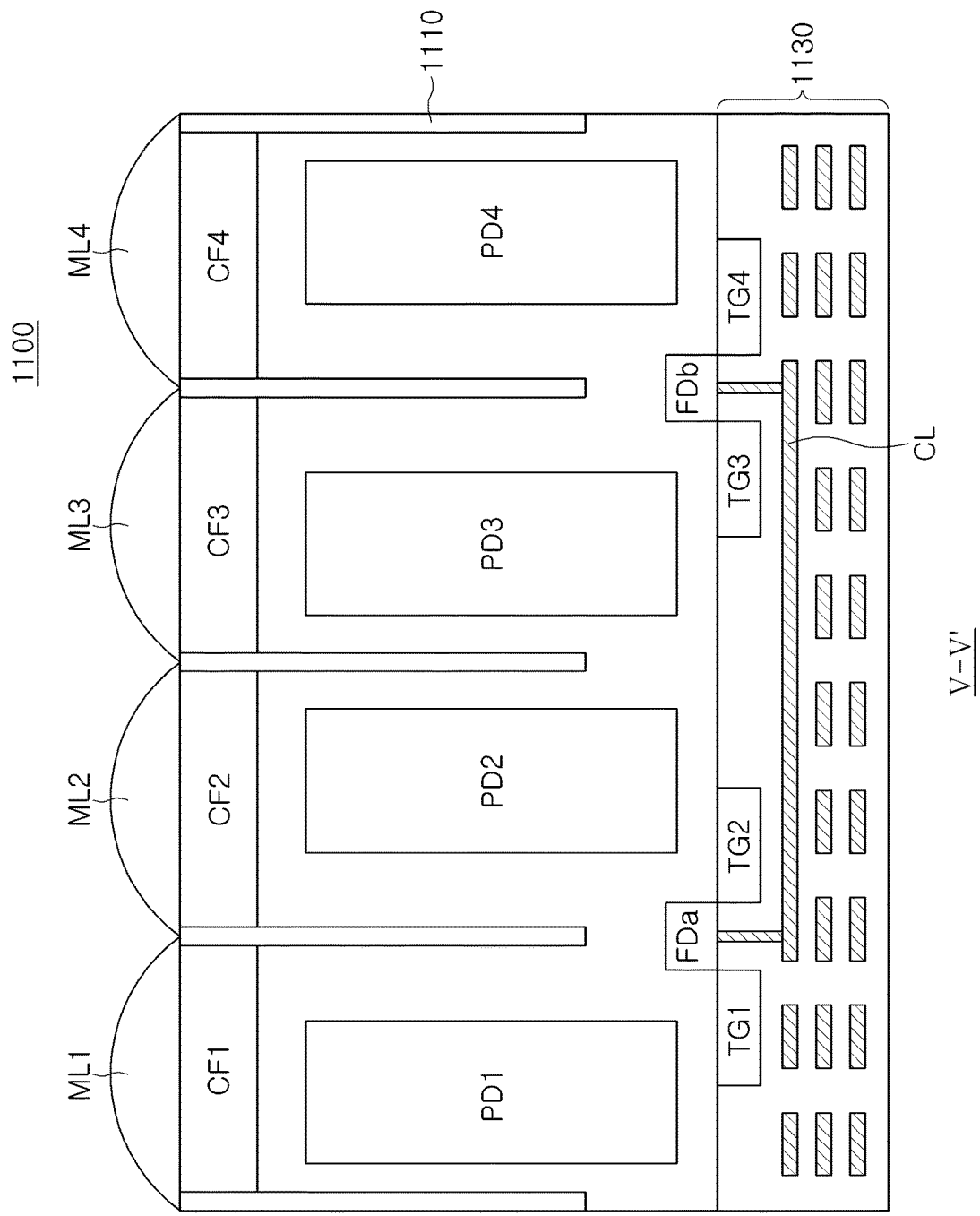
FIG. 14A illustrates a cross-sectional view taken along line V-V' of FIG. 13.
Figure 14B:
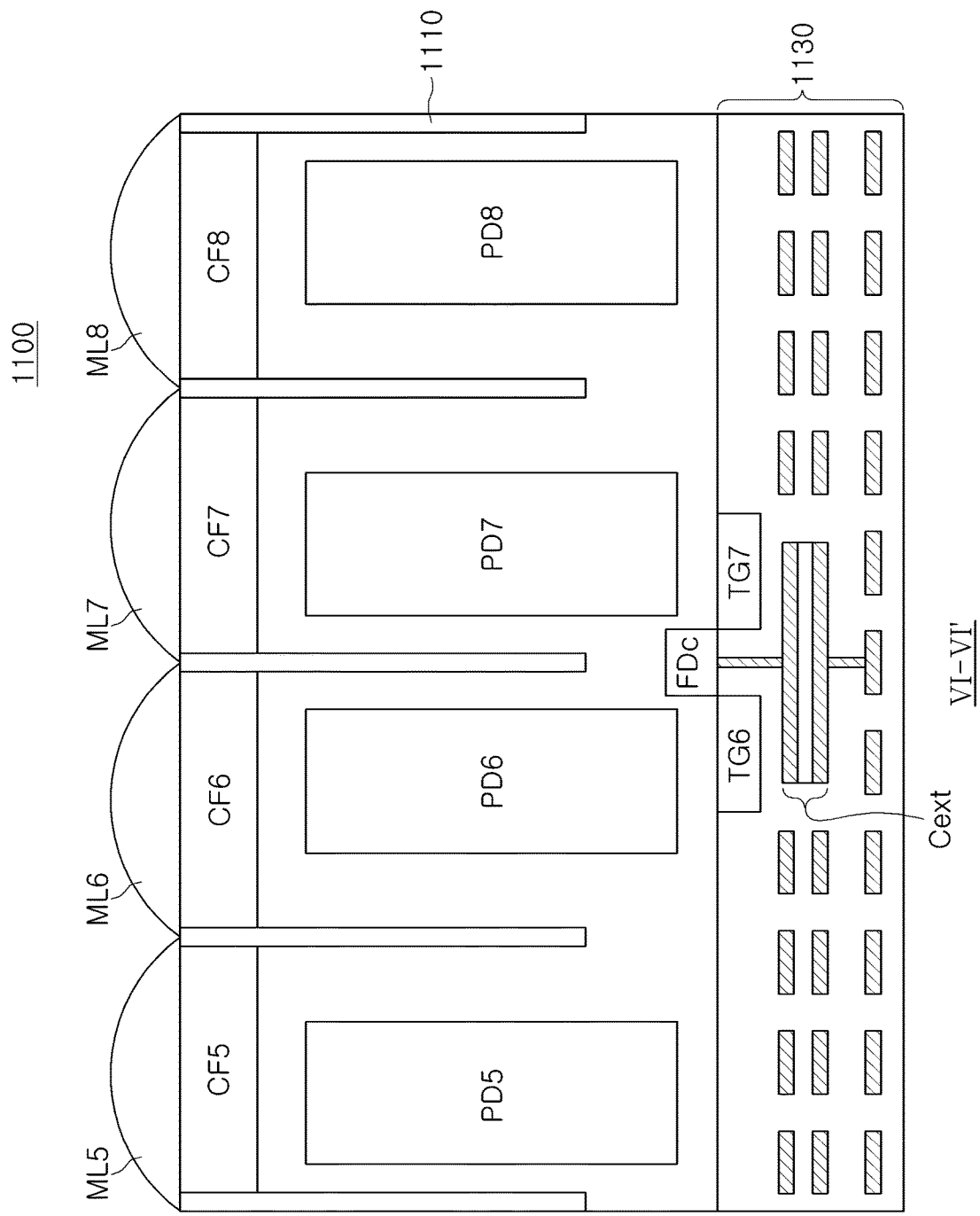
FIG. 14B illustrates a cross-sectional view taken along line VI-VI' of FIG. 13.

FIG. 13 illustrates a plan view of the pixel group of FIG. 12. FIG. 14A illustrates a cross-sectional view taken along line V-V' of FIG. 13, and FIG. 14B illustrates a cross-sectional view taken along line VI-VI' of FIG. 13.

Referring first to FIG. 13, a pixel group 1100 may include first to sixteenth photodiodes PD1 to PD16, first to sixteenth transfer gate electrodes TG1 to TG16, and first to fifth floating diffusion regions FDa to FDe.

The first to sixteenth transfer gate electrodes TG1 to TG16 may be gate electrodes of first to sixteenth transfer transistors connected to the first to sixteenth photodiodes PD1 to PD16.

The first to sixteenth photodiodes PD1 to PD16 may constitute different pixels. In an embodiment, the first to fifth photodiodes PD1 to PD5 and the eighth to sixteenth photodiodes PD8 to PD16 may constitute low-illuminance pixels. Also, the sixth and seventh photodiodes PD6 and PD7 may constitute high-illuminance pixels.

The first, second, and fifth photodiodes PD1, PD2, and PD5 may be commonly connected to the first floating diffusion region FDa. The third, fourth, and eighth photodiodes PD3, PD4, and PD8 may be commonly connected to the second floating diffusion region FDb. The ninth, tenth, thirteenth, and fourteenth photodiodes PD9, PD10, PD13, and PD14 may be commonly connected to the fourth floating diffusion region FDd. Also, the eleventh, twelfth, fifteenth, and sixteenth photodiodes PD11, PD12, PD15, and PD16 may be commonly connected to the fifth floating diffusion region FDe.

The sixth and seventh photodiodes PD6 and PD7 may be commonly connected to the third floating diffusion region FDc.

An expansion capacitor Cext may be disposed below the sixth and seventh photodiodes PD6 and PD7 constituting high-illuminance pixels. The expansion capacitor Cext may be connected to the third floating diffusion region FDc to increase capacitance of the third floating diffusion region FDc. In an embodiment, the expansion capacitor Cext may a metal-insulator-metal (MIM) capacitor or a poly-insulator-poly (PIP) capacitor, and may have capacitance of 1 fF or more and less than 1 pF. In an embodiment, the expansion capacitor Cext may extend in a direction parallel to a substrate, to partially overlap the low-illuminance pixels.

The cross-section taken along line V-V' of FIG. 13 may be as illustrated in FIG. 14A.

Referring to FIG. 14A, a pixel group 1100 may include first to fourth photodiodes PD1 to PD4, an element isolation layer 1110, a pixel circuit region 1130, and first and second floating diffusion regions FDa and FDb.

Each of the first to fourth photodiodes PD1 to PD4 may constitute different pixel regions. A plurality of pixel regions including the first to fourth photodiodes PD1 to PD4 may be isolated from each other by the element isolation layer 1110. The element isolation layer 1110 may optically shield the plurality of pixel regions, to prevent crosstalk due to optical interference. The element isolation layer 1110 may extend from lower surfaces of micro-lenses ML1 to ML4 to be disposed between the plurality of pixel regions in a vertical direction. The element isolation layer 1110 may for example be formed using a trench process, a local-oxidation-of-silicon (LOCOS) process, or the like. When the element isolation layer 1110 is formed by using a trench process, the element isolation layer 1110 may have a deep-trench-isolation (DTI) structure or a shallow-trench-isolation (STI) structure. In an embodiment, the element isolation layer 1110 may have a full-deep-trench-isolation (FDTI) structure extending from lower surfaces of the micro-lenses ML1 to ML4 to an upper surface of the pixel circuit region 1130.

The pixel circuit region 1130 may include first to fourth transfer gate electrodes TG1 to TG4 and a plurality of metal lines.

When a first transfer transistor is turned on according to a control signal input to the first transfer gate electrode TG1, a charge generated by the first photodiode PD1 may move to the first floating diffusion region FDa. In addition, when a second transfer transistor is turned on according to a control signal input to the second transfer gate electrode TG2, a charge generated by the second photodiode PD2 may move to the first floating diffusion region FDa. As a result, the first floating diffusion region FDa may store the charges generated by the first photodiode PD1 and the second photodiode PD2.

When a third transfer transistor is turned on according to a control signal input to the third transfer gate electrode TG3, a charge generated by the third photodiode PD3 may move to the second floating diffusion region FDb. In addition, when a fourth transfer transistor is turned on according to a control signal input to the fourth transfer gate electrode TG4, a charge generated by the fourth photodiode PD4 may move to the second floating diffusion region FDb. As a result, the second floating diffusion region FDb may store the charges generated by the third photodiode PD3 and the fourth photodiode PD4.

The first floating diffusion region FDa and the second floating diffusion region FDb may be electrically connected through the metal line CL. Therefore, the first floating diffusion region FDa and the second floating diffusion region FDb may share the charges respectively stored therein. For example, charges generated by the first to fourth photodiodes PD1 to PD4 in response to an optical signal incident from an external source may be used to generate one image data. Different than as shown in FIG. 14A, in other embodiments positions and the number of the metal lines CL electrically connecting the first floating diffusion region FDa and the second floating diffusion region FDb may be variously modified.

The cross-section taken along line VI-VI' of FIG. 13 may be as illustrated in FIG. 14B.

Referring to FIG. 14B, a pixel group 1100 may include fifth to eighth photodiodes PD5 to PD8, an element isolation layer 1110, a pixel circuit region 1130, and a third floating diffusion region FDc. Hereinafter, differences between a vertical structure of the pixel group 1100 shown in FIG. 14B and the vertical structure of the pixel group 1100 shown in FIG. 14A will be described.

Each of the fifth to eighth photodiodes PD5 to PD8 may configure a plurality of pixels isolated from each other by the element isolation layer 1110. In an embodiment, each of the fifth photodiode PD5 and the eighth photodiode PD8 may constitute a low-illuminance pixel, and each of the sixth photodiode PD6 and the seventh photodiode PD7 may constitute a high-illuminance pixel.

The sixth photodiode PD6 and the seventh photodiode PD7 may be commonly connected to the third floating diffusion region FDc. When a sixth transfer transistor is turned on according to a control signal input to the sixth transfer gate electrode TG6, a charge generated by the sixth photodiode PD6 may move to the third floating diffusion region FDc. In addition, when a seventh transfer transistor is turned on according to a control signal input to the seventh transfer gate electrode TG7, a charge generated by the seventh photodiode PD7 may move to the third floating diffusion region FDc. As a result, the charges generated by the sixth photodiode PD6 and the seventh photodiode PD7 in response to an optical signal incident from an external source may be stored in the third floating diffusion region FDc, and may be used to generate one image data.

An expansion capacitor Cext may be connected to a lower portion of the third floating diffusion region FDc through a metal line. In an embodiment, the expansion capacitor Cext may include a metal-insulator-metal (MIM) capacitor or a poly-insulator-poly (PIP) capacitor.

Figure 15:
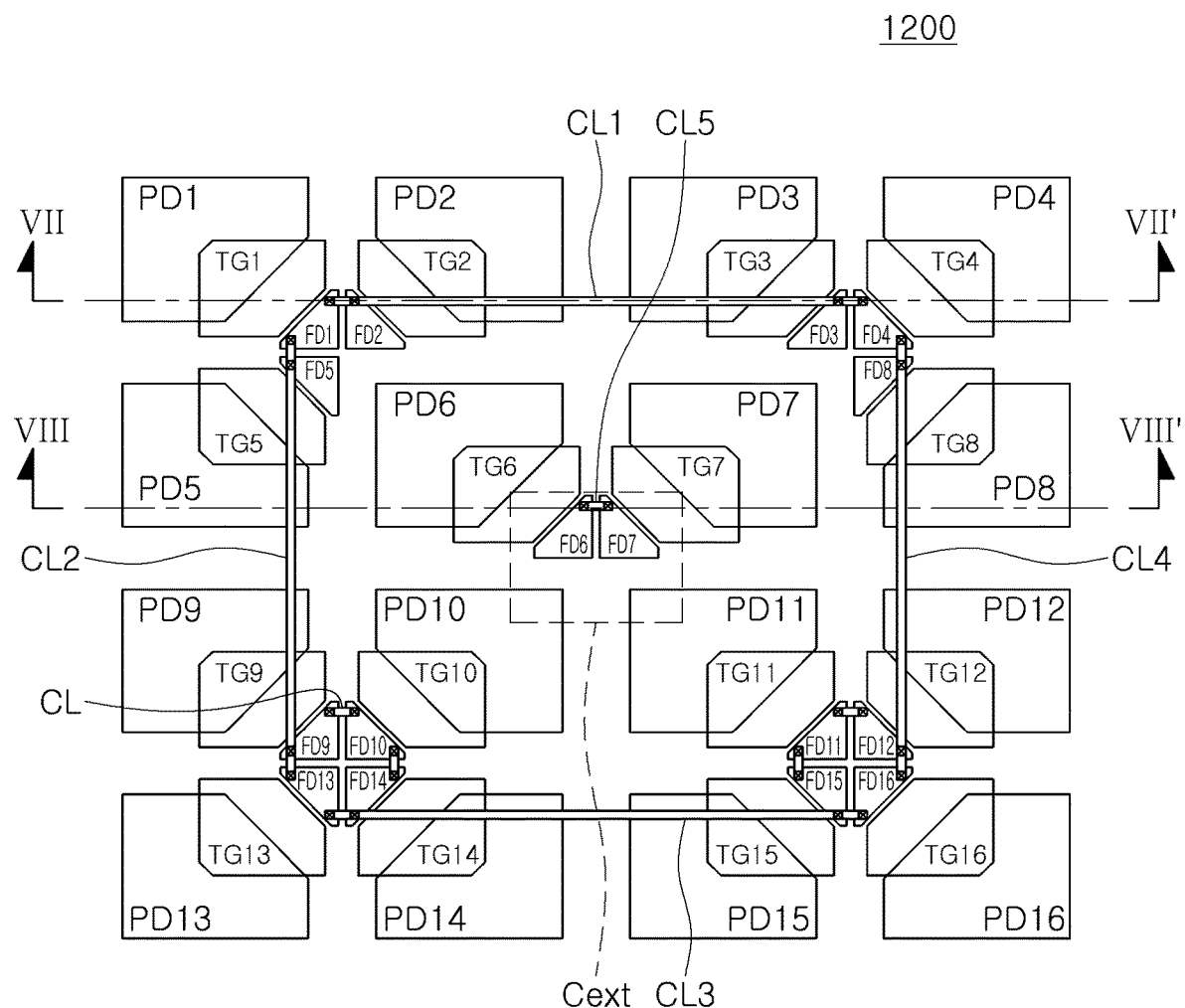
FIG. 15 illustrates a plan view of the pixel group of FIG. 12 according to other embodiments of the inventive concepts.
Figure 16A:
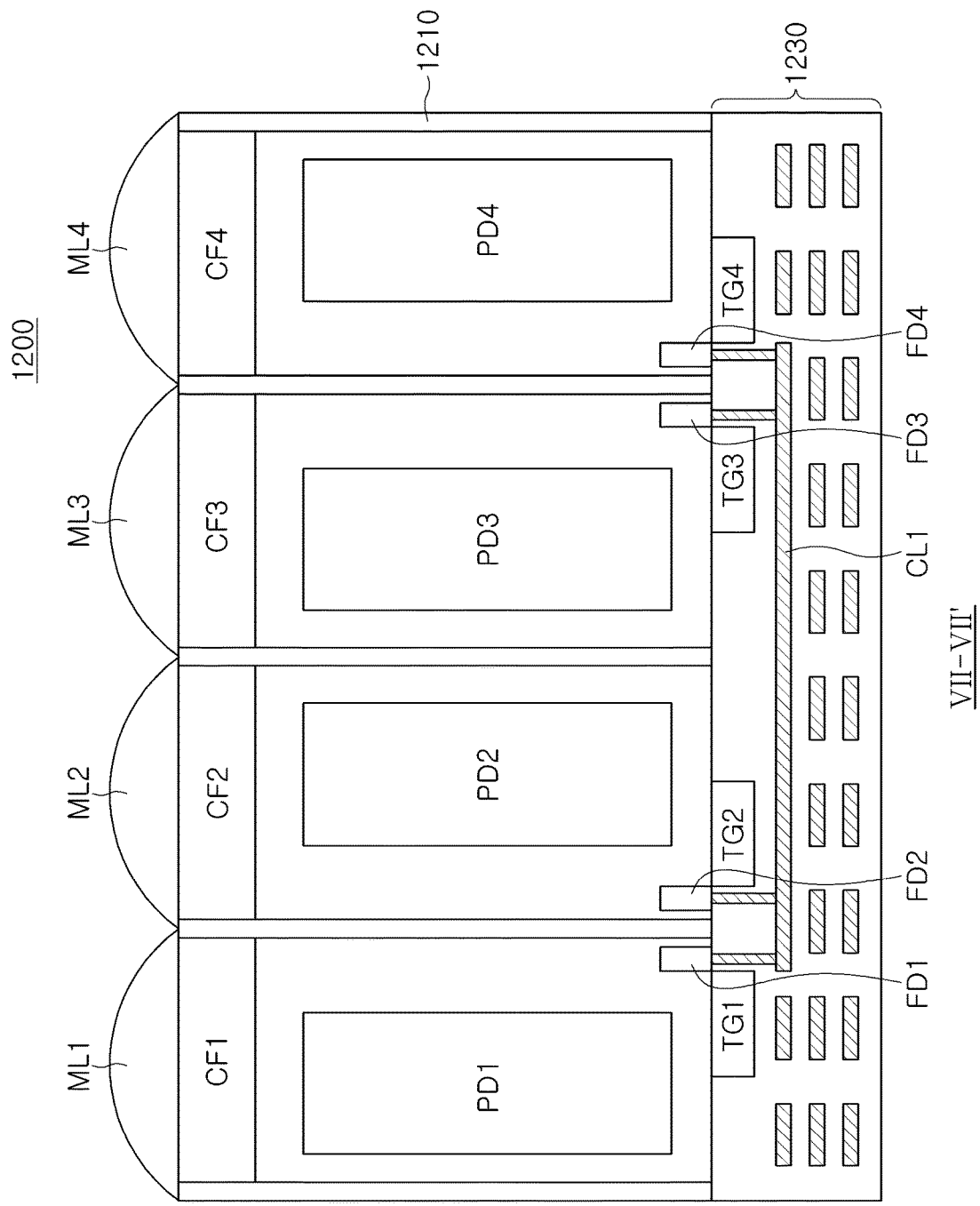
FIG. 16A illustrates a cross-sectional view taken along line VII-VII' of FIG. 15.
Figure 16B:
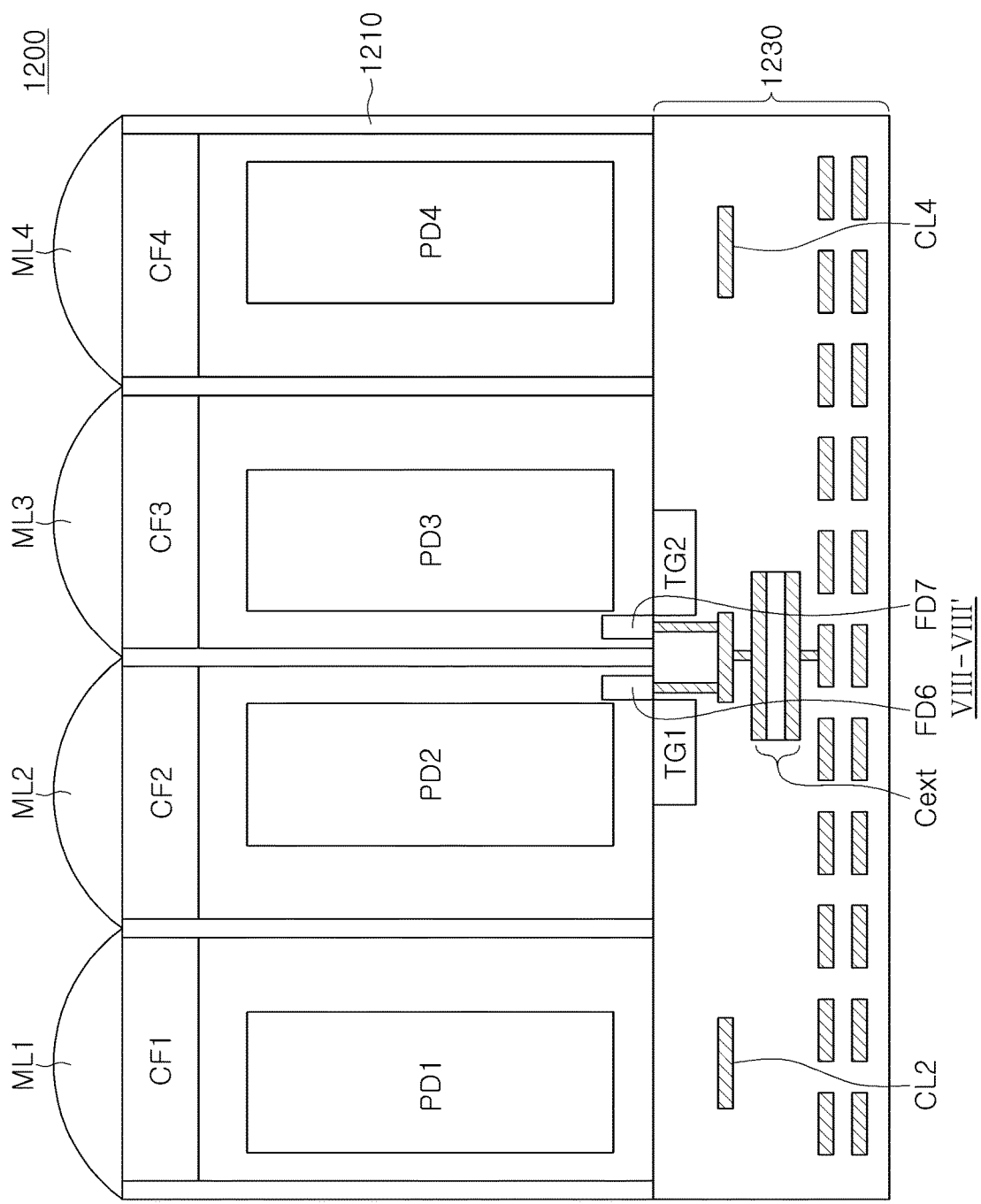
FIG. 16B illustrates a cross-sectional view taken along line VIII-VIII' of FIG. 15.
Figure 17:
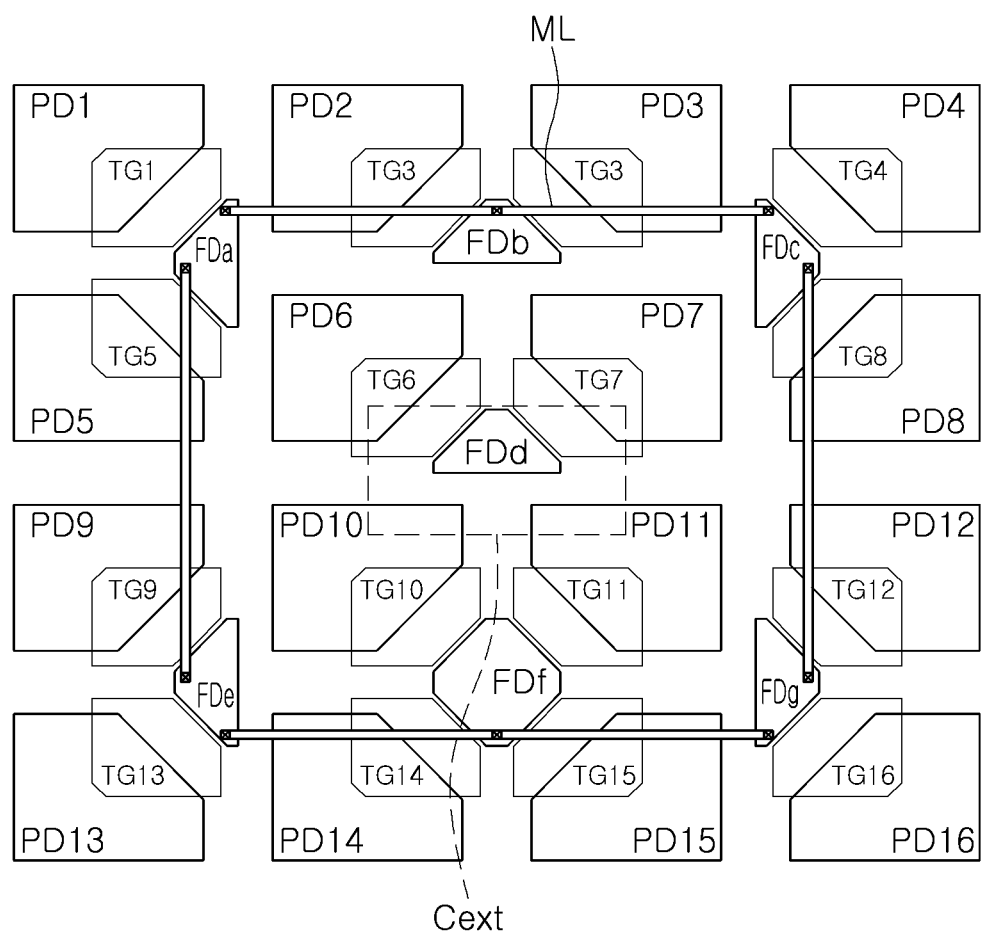
FIG. 17 illustrates a plan view of the pixel group of FIG. 12 according to other embodiments of the inventive concepts.

FIG. 15 illustrates a plan view of the pixel group of FIG. 12 according to embodiments of the inventive concepts. FIG. 16A illustrates a cross-sectional view taken along line VII-VII' of FIG. 15, and FIG. 16B illustrates a cross-sectional view taken along line VIII-VIII' of FIG. 15. FIG. 17 illustrates a plan view of the pixel group of FIG. 12 according to embodiments of the inventive concepts.

Referring first to FIG. 15, a pixel group 1200 may include first to sixteenth photodiodes PD1 to PD16, first to sixteenth transfer gate electrodes TG1 to TG16, and first to sixteenth floating diffusion regions PD1 to PD16.

The first to sixteenth transfer gate electrodes TG1 to TG16 may be gate electrodes of first to sixteenth transfer transistors connected to the first to sixteenth photodiodes PD1 to PD16.

The first to sixteenth photodiodes PD1 to PD16 may constitute different pixels. In an embodiment, the first to fifth photodiodes PD1 to PD5 and the eighth to sixteenth photodiodes PD8 to PD16 may constitute low-illuminance pixels. Also, the sixth and seventh photodiodes PD6 and PD7 may constitute high-illuminance pixels.

The first to sixteenth photodiodes PD1 to PD16 may be connected to the first to sixteenth floating diffusion regions FD1 to FD16, respectively. Different than in FIG. 13, the first to sixteenth photodiodes PD1 to PD16 in FIG. 15 may be respectively connected to different floating diffusion regions FD1 to FD16, but the plurality of floating diffusion regions FD1 to FD16 may be divided for high-illuminance and low-illuminance pixels to be electrically connected to each other, and may share charges with each other.

The first to fourth floating diffusion regions FD1 to FD4 may be electrically connected by a first metal line CL1. The first, fifth, ninth, and thirteenth floating diffusion regions FD1, FD5, FD9, and FD13 may be electrically connected by a second metal line CL2. The thirteenth to sixteenth floating diffusion regions FD13 to FD16 may be electrically connected by a third metal line CL3. The fourth, eighth, twelfth, and sixteenth floating diffusion regions FD4, FD8, FD12, and FD16 may be electrically connected by a fourth metal line CL4. The ninth, tenth, thirteenth, and fourteenth floating diffusion regions FD9, FD10, FD13, and FD14 may be electrically connected by a plurality of metal lines CL. Also, the eleventh, twelfth, fifteenth, and sixteenth floating diffusion regions FD11, FD12, FD15, and FD16 may be electrically connected by a plurality of metal lines CL. As a result, the first to fifth floating diffusion regions FD1 to FD5 and the eighth to sixteenth floating diffusion regions FD8 to FD16 may be electrically connected to share charges with each other.

In addition, the sixth and seventh floating diffusion regions FD6 and FD7 may be electrically connected by a metal line CL to share charges.

An expansion capacitor Cext may be disposed below the sixth and seventh photodiodes PD6 and PD7. The expansion capacitor Cext may be commonly connected to the sixth and seventh floating diffusion regions FD6 and FD7 to increase capacitance of the sixth and seventh floating diffusion regions FD6 and FD7. In an embodiment, the expansion capacitor Cext may be a MIM capacitor or a PIP capacitor, and may have capacitance of 1 fF or more and less than 1 pF. In an embodiment, the expansion capacitor Cext may extend in a direction parallel to a substrate, to partially overlap the low-illuminance pixels.

The cross-section taken along line VII-VII' of FIG. 15 may be as illustrated in FIG. 16A.

Referring to FIG. 16A, a pixel group 1200 may include first to fourth photodiodes PD1 to PD4, an element isolation layer 1210, a pixel circuit region 1230, and first to fourth floating diffusion regions FD1 to FD4. The pixel circuit region 1230 may include first to fourth transfer gate electrodes TG1 to TG4 and a plurality of metal lines.

A plurality of pixel regions respectively including the first to fourth photodiodes PD1 to PD4 may be isolated from each other by the element isolation layer 1210. The element isolation layer 1210 may optically shield the plurality of pixel regions, to prevent crosstalk due to optical interference. The element isolation layer 1210 may extend in a vertical direction from lower surfaces of micro-lenses ML1 to ML4 to be disposed between the plurality of pixel regions. The element isolation layer 1210 may be formed using a trench process, a local-oxidation-of-silicon (LOCOS) process, or the like. When the element isolation layer 1210 is formed by using a trench process, the element isolation layer 1210 may have a deep-trench-isolation (DTI) structure or a shallow-trench-isolation (STI) structure. In an embodiment, the element isolation layer 1210 may have a full-deep-trench-isolation (FDTI) structure extending from lower surfaces of the micro-lenses ML1 to ML4 to an upper surface of the pixel circuit region 1230.

The first floating diffusion region FD1 and the second floating diffusion region FD2 may be electrically connected through a first metal line CL1. Also, the third floating diffusion region FD3 and the fourth floating diffusion region FD4 may be electrically connected through the first metal line CL1. As a result, the first to fourth floating diffusion regions FD1 to FD4 may be electrically connected through the first metal line CL1 to share charges.

When first to fourth transfer transistors are turned on according to a control signal input to each of the first to fourth transfer gate electrodes TG1 to TG4, charges generated by the first to fourth photodiodes PD1 to PD4 may move to the first to fourth floating diffusion regions FD1 to FD4, respectively. Since the first to fourth floating diffusion regions FD1 to FD4 may be electrically connected to share charges, the charges generated by the first to fourth photodiodes PD1 to PD4 in response to an optical signal incident from an external source may be used to generate one image data. Different than as shown in FIG. 16A, in other embodiments the number and arrangement of metal lines CL electrically connecting the first to fourth floating diffusion regions FD1 to FD4 may be variously modified.

The cross-section taken along line VIII-VIII' of FIG. 15 may be as illustrated in FIG. 16B.

Referring to FIG. 16B, a pixel group 1200 includes fifth to eighth photodiodes PD5 to PD8, an element isolation layer 1210, a pixel circuit region 1230, and sixth and seventh floating diffusion regions FD6 and FD7. Hereinafter, differences between a vertical structure of the pixel group 1200 as shown in FIG. 16b and the vertical structure of the pixel group 1200 as shown in FIG. 16A will be described.

Each of the fifth to eighth photodiodes PD5 to PD8 may configure a plurality of pixels isolated from each other by the element isolation layer 1210. In an embodiment, each of the fifth photodiode PD5 and the eighth photodiode PD8 may constitute a low-illuminance pixel, and each of the sixth photodiode PD6 and the seventh photodiode PD7 may constitute a high-illuminance pixel.

When a sixth transfer transistor is turned on according to a control signal input to the sixth transfer gate electrode TG6, a charge generated by the sixth photodiode PD6 may move to the sixth floating diffusion region FD6. Further, when a seventh transfer transistor is turned on according to a control signal input to the seventh transfer gate electrode TG7, a charge generated by the seventh photodiode PD7 may move to the seventh floating diffusion region FD7.

The sixth floating diffusion region FD6 and the seventh floating diffusion regions FD7 may be electrically connected through a fifth metal line CL5. Therefore, the sixth floating diffusion region FD6 and the seventh floating diffusion region FD7 may share stored charges with each other. Also, an expansion capacitor Cext may be connected to lower portions of the sixth and seventh floating diffusion regions FD6 and FD7 through a metal line. In an embodiment, the expansion capacitor Cext may include a metal-insulator-metal (MIM) capacitor or a poly-insulator-poly (PIP) capacitor.

As a result, the charges generated by the sixth photodiode PD6 and the seventh photodiode PD7 in response to an optical signal incident from an external source may be used to generate one image data.

A method of connecting the plurality of floating diffusion regions FD1 to FD16 may be variously modified. For example, referring to FIG. 17, in other embodiments the first and fifth photodiodes PD1 and PD5 may share the first floating diffusion region FDa. The second and third photodiodes PD2 and PD3 may share the second floating diffusion region FDb. The fourth and eighth photodiodes PD4 and PD8 may share the third floating diffusion region FDc. The ninth and thirteenth photodiodes PD9 and PD13 may share the fifth floating diffusion region FDe. The tenth, eleventh, fourteenth, and fifteenth photodiodes PD10, PD11, PD14, and PD15 may share the sixth floating diffusion region FDf. Also, the twelfth and sixteenth photodiodes PD12 and PD16 may share the seventh floating diffusion region FDg. The first to third floating diffusion regions FDa to FDc and the fifth to seventh floating diffusion regions FDe-FDg provided to the low-illuminance pixel may be electrically connected through a metal line CL to share charges.

Further, the sixth and seventh photodiodes PD6 and PD7 constituting the high-illuminance pixels may share the fourth floating diffusion region FDd.

Figure 18:
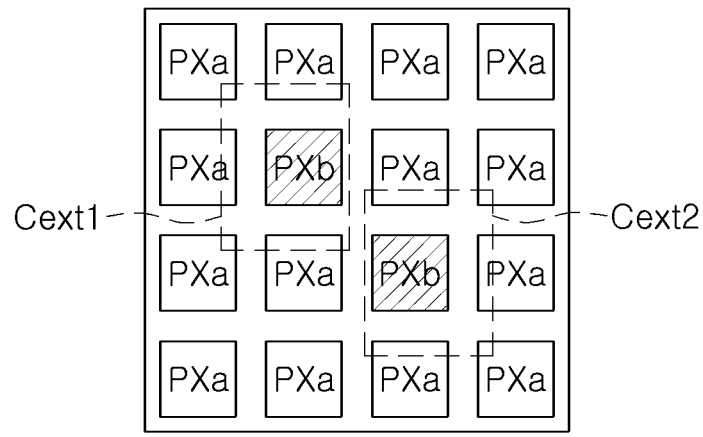
FIG. 18 illustrates a view of a pixel group that may be included in the pixel array of FIG. 11.
Figure 19:
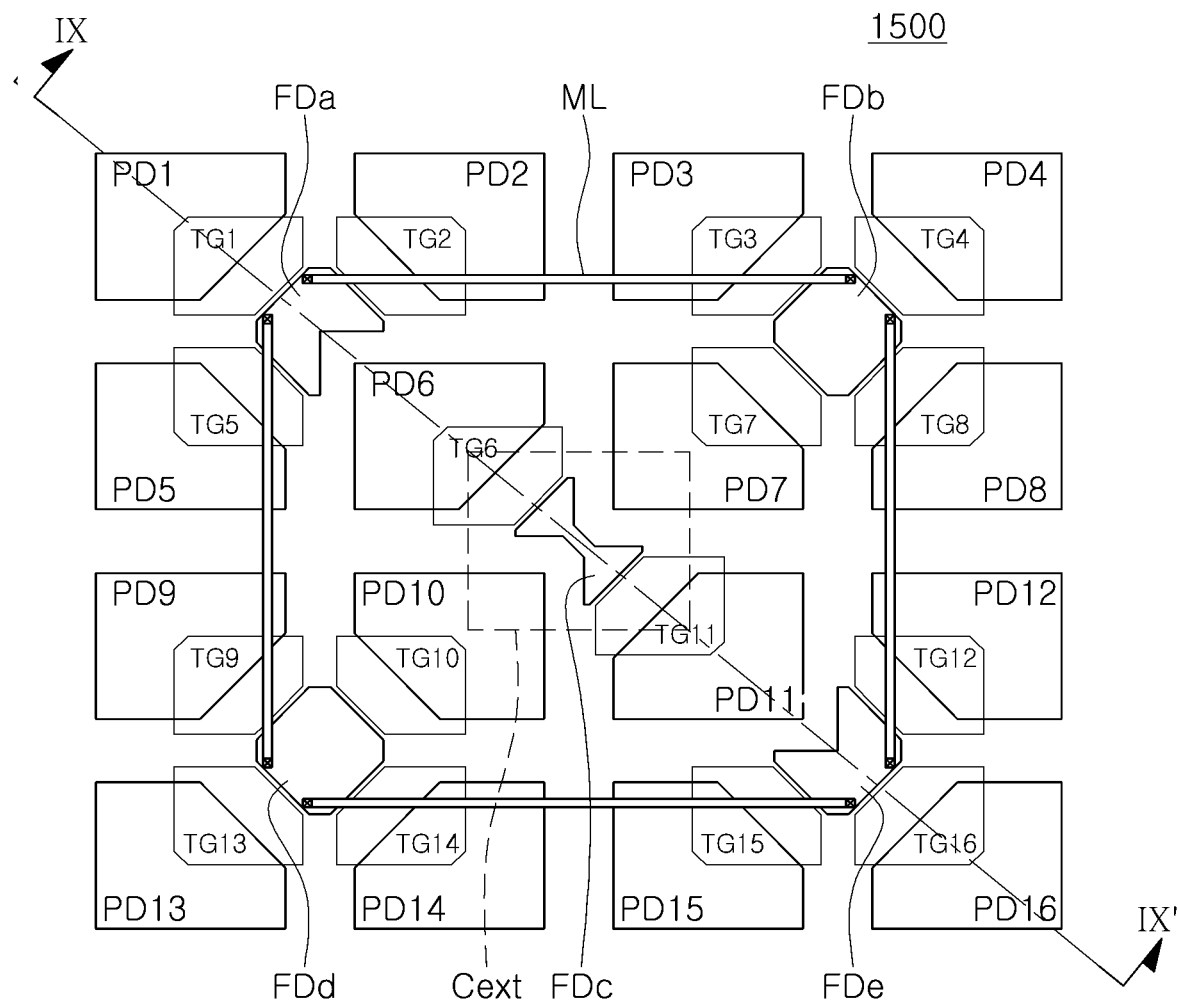
FIG. 19 illustrates a plan view of the pixel group of FIG. 18.
Figure 20A:
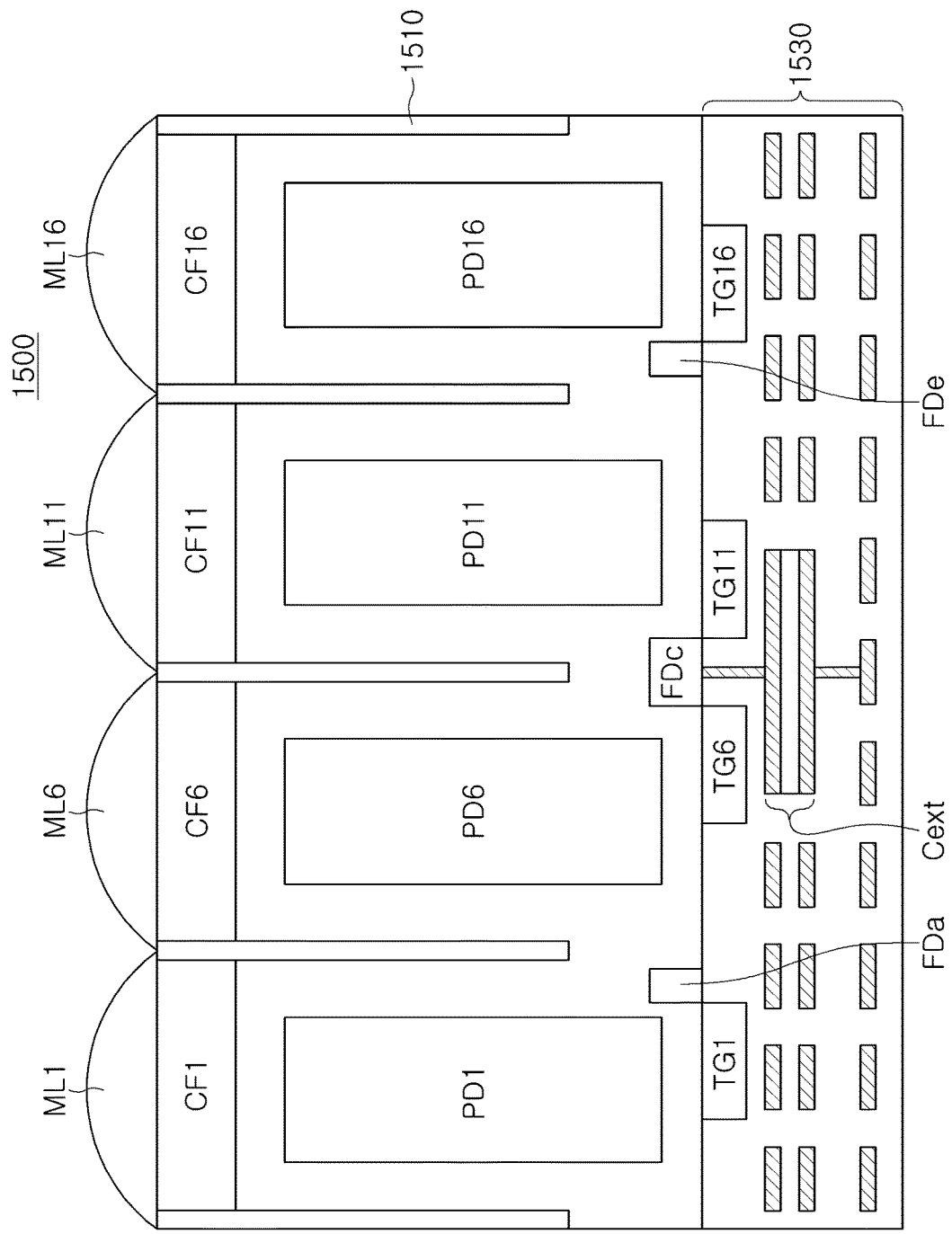
FIG. 20A illustrates a cross-sectional view taken along line IX-IX' of FIG. 19 according to embodiments of the inventive concepts.
Figure 20B:
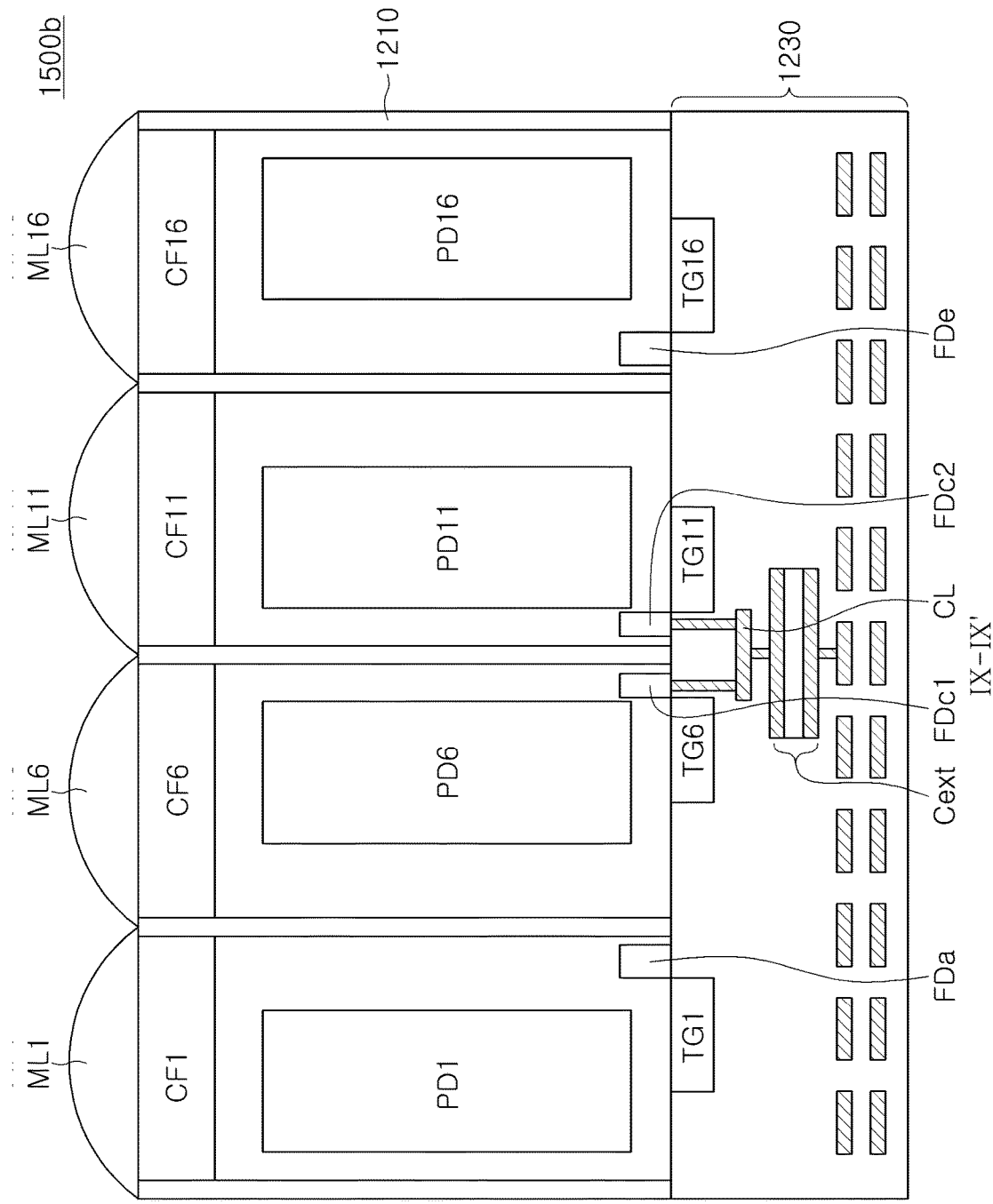
FIG. 20B illustrates a cross-sectional view taken along line IX-IX' of FIG. 19 according to other embodiments of the inventive concepts.

FIG. 18 illustrates a view of a pixel group that may be included in the pixel array of FIG. 11 according to embodiments of the inventive concepts. FIG. 19 illustrates a plan view of the pixel group of FIG. 18. FIG. 20A is a cross-sectional view taken along line IX-IX' of FIG. 19 according to embodiments of the inventive concepts. FIG. 20B is a cross-sectional view taken along line IX-IX' of FIG. 19 according to other embodiments of the inventive concepts.

Referring first to FIG. 18, a pixel group 1400 may include 16 pixels PXa and PXb having a 4×4 matrix structure. In an embodiment, at least one pixel, among a plurality of pixels included in the pixel group 1400, may be a high-illuminance pixel, and remaining pixels thereof may be low-illuminance pixels. For example, the pixel group 1400 may include two high-illuminance pixels PXb and 14 low-illuminance pixels PXa.

Unlike the pixel group 1000 described with reference to FIG. 12, in the pixel group 1400 of FIG. 18, high-illuminance pixels PXb may be arranged in a diagonal direction. The position and number of high-illuminance pixels PXb included in the pixel group 1400 may be variously modified based on dynamic range requirements, light-receiving efficiency, or the like.

Different from the low-illuminance pixels PXa, the high-illuminance pixels PXb may further include expansion capacitors Cext1 and Cext2. Therefore, the high-illuminance pixels PXb may have a floating diffusion region having capacitance greater than capacitance of the floating diffusion regions of the low-illuminance pixels PXa. Therefore, in a case that an image sensor operates in a high dynamic range (HDR) mode, since charge loss may be prevented even when exposure time of the high-illuminance pixels PXb is controlled to be the same as exposure time of the low-illuminance pixels PXa, image data having a relatively high resolution and a relatively high dynamic range may be acquired.

The expansion capacitors Cext1 and Cext2 may be disposed in a pixel circuit region of the high-illuminance pixels PXb. In an embodiment, the expansion capacitors Cext1 and Cext2 may extend in a direction parallel to a substrate, to partially overlap the low-illuminance pixel PXa. In an embodiment, the expansion capacitors Cext1 and Cext2 may include a metal-insulator-metal (MIM) capacitor, or a poly-insulator-poly (PIP) capacitor. In addition, the expansion capacitors Cext1 and Cext2 may have capacitance of 1 fF or more and less than 1 pF.

The high-illuminance pixels PXb may have the same size and characteristics as the low-illuminance pixels PXa, except that the high-illuminance pixels PXb may further include expansion capacitors Cext1 and Cext2 connected to the floating diffusion regions.

Referring to FIG. 19, a pixel group 1500 may include first to sixteenth photodiodes PD1 to PD16, first to sixteenth transfer gate electrodes TG1 to TG16, and first to fifth floating diffusion regions FDa to FDe.

The first to sixteenth transfer gate electrodes TG1 to TG16 may be gate electrodes of first to sixteenth transfer transistors connected to the first to sixteenth photodiodes PD1 to PD16.

The first to sixteenth photodiodes PD1 to PD16 may constitute different pixels. In an embodiment, the first to fifth photodiodes PD1 to PD5, the seventh to tenth photodiodes PD7 to PD10, and the twelfth to sixteenth photodiodes PD12 to PD16 may constitute low-illuminance pixels. Also, the sixth and eleventh photodiodes PD6 and PD11 may constitute high-illuminance pixels.

The first, second, and fifth photodiodes PD1, PD2, and PD5 may be commonly connected to the first floating diffusion region FDa. The first floating diffusion region FDa may store charges generated by the first, second, and fifth photodiodes PD1, PD2, and PD5. The third, fourth, seventh, and eighth photodiodes PD3, PD4, PD7, and PD8 may be commonly connected to the second floating diffusion region FDb. The second floating diffusion region FDb may store charges generated by the third, fourth, seventh, and eighth photodiodes PD3, PD4, PD7, and PD8. The ninth, tenth, thirteenth, and fourteenth photodiodes PD9, PD10, PD13, and PD14 may be commonly connected to the fourth floating diffusion region FDd. The fourth floating diffusion region FDd may store charges generated by the ninth, tenth, thirteenth, and fourteenth photodiodes PD9, P10, PD13, and PD14. The twelfth, fifteenth, and sixteenth photodiodes PD12, PD15, and PD16 may be commonly connected to the fifth floating diffusion region FDe. The fifth floating diffusion region FDe may store charges generated by the twelfth, fifteenth, and sixteenth photodiodes PD12, PD15, and PD16. The first, second, fourth, and fifth floating diffusion regions FDa, FDb, FDd, and FDe may be electrically connected by a metal line CL to share charges.

Also, the sixth and eleventh photodiodes PD6 and PD11 may be commonly connected to the third floating diffusion region FDc. The third floating diffusion region FDc may store charges generated by the sixth and eleventh photodiodes PD6 and PD11. An expansion capacitor Cext may be disposed below the sixth and seventh photodiodes PD6 and PD7. The expansion capacitor Cext may be connected to the third floating diffusion region FDc to increase capacitance of the third floating diffusion region FDc. In an embodiment, the expansion capacitor Cext may be a MIM capacitor or a PIP capacitor, and may have capacitance of 1 fF or more and less than 1 pF. In an embodiment, the expansion capacitor Cext may extend in a direction parallel to a substrate, to partially overlap the low-illuminance pixels.

The cross-section taken along line IX-IX' of FIG. 19 may be as illustrated in FIG. 20.

Referring to FIG. 20A, a pixel group 1500 may include first, sixth, eleventh, and sixteenth photodiodes PD1, PD6, PD11, and PD16, an element isolation layer 1510, a pixel circuit region 1530, and a third floating diffusion region FDc. The pixel circuit region 1530 may include first, sixth, eleventh, and sixteenth transfer gate electrodes TG1, TG6, TG11, and TG16 and a plurality of metal lines.

A plurality of pixel regions respectively including the first, sixth, eleventh, and sixteenth photodiodes PD1, PD6, PD11, and PD16 may be isolated from each other by the element isolation layer 1510. The element isolation layer 1510 may optically shield the plurality of pixel regions, to prevent crosstalk due to optical interference. The element isolation layer 1510 may extend in a vertical direction from lower surfaces of micro-lenses ML1, ML6, ML11, and ML16 to be disposed between the plurality of pixel regions. The element isolation layer 1510 may have a deep-trench-isolation (DTI) structure or a shallow-trench-isolation (STI) structure.

When a sixth transfer transistor is turned on according to a control signal input to the sixth transfer gate electrode TG6, a charge generated by the sixth photodiode PD6 may move to the third floating diffusion region FDc. In addition, when a eleventh transfer transistor is turned on according to a control signal input to the eleventh transfer gate electrode TG11, a charge generated by the eleventh photodiode PD11 may move to the third floating diffusion region FDc. The charges generated by the sixth photodiode PD6 and the eleventh photodiode PD11 may be stored in the third floating diffusion region FDc, and may be used to generate one image data.

An expansion capacitor Cext may be connected to a lower portion of the third floating diffusion region FDc through a metal line. The expansion capacitor may increase capacitance of the third floating diffusion region FDc. In an embodiment, the expansion capacitor Cext may include a metal-insulator-metal (MIM) capacitor, or a poly-insulator-poly (PIP) capacitor.

FIG. 20B illustrates an alternative to the cross-section of FIG. 20A according to embodiments of the inventive concepts. Hereinafter, differences between a vertical structure of the pixel group 1500 in FIG. 20B and the vertical structure of the pixel group 1500 in FIG. 20A will be described.

In the embodiment of FIG. 20B, the element isolation layer 1510 may have a full-deep-trench-isolation (FDTI) structure extending from lower surfaces of the micro-lenses ML1, ML6, ML11, and ML16 to an upper surface of the pixel circuit region 1530. Instead of the third floating diffusion region FDc connectable to the sixth photodiode PD6 and the eleventh photodiode PD11 respectively by way of transfer transistors including the sixth and eleventh transfer gate electrodes TG6 and TG11 as shown in FIG. 20A, in FIG. 20B floating diffusion regions FDc1 and FDc2 are provided as separate from each other in a direction parallel to the substrate. The floating diffusion regions FDc1 and FDc2 are respectively connectable to the sixth photodiode PD6 and the eleventh photodiode PD11 respectively by way of transfer transistors including the sixth and eleventh transfer gate electrodes TG6 and TG11. The floating diffusion regions FDc1 and FDc2 are isolated from each other by the element isolation region 1510. The floating diffusion regions FDc1 and FDc2 may be electrically connected to each other by a metal line CL to share charges. An expansion capacitor Cext may be connected to lower portions of the floating diffusion regions FDc1 and FDc2 through a metal line CL. The expansion capacitor may increase capacitance of the floating diffusion regions FDc1 and FDc2. In an embodiment, the expansion capacitor Cext may include a metal-insulator-metal (MIM) capacitor, or a poly-insulator-poly (PIP) capacitor.

Figure 21:
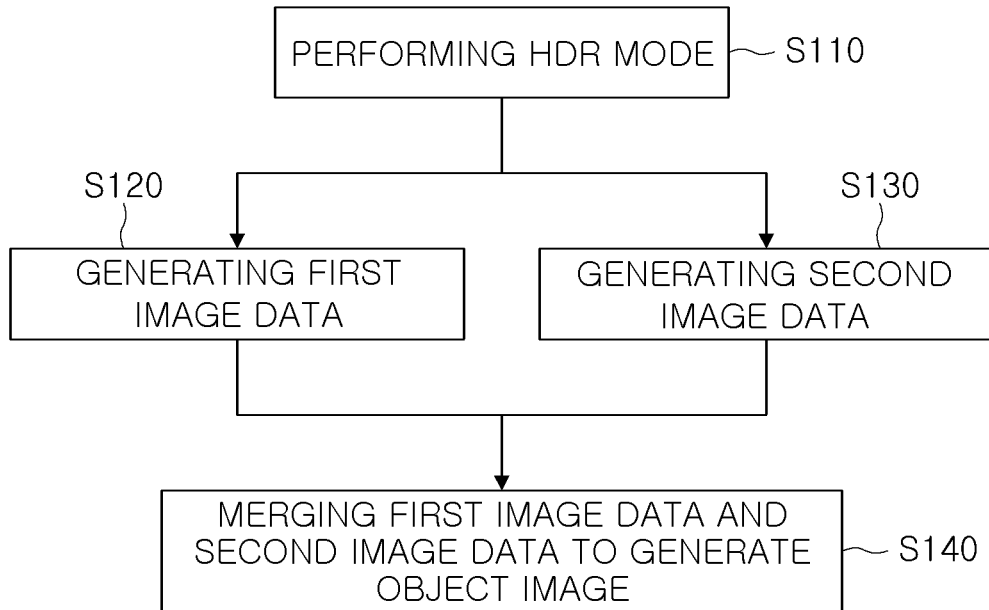
FIG. 21 illustrates a flowchart of an operation method of an imaging device according to embodiments of the inventive concepts.

FIG. 21 illustrates a flowchart of an operation method of an imaging device according to embodiments of the inventive concepts.

Referring to FIG. 21, an imaging device may perform a high dynamic range (HDR) mode in response to a user input (S110). In addition, the imaging device may detect an illumination environment using an illuminance sensor or the like to automatically perform the HDR mode.

In the HDR mode, an image sensor may select any one of a plurality of row lines, and may expose at least one first pixel connected to the selected row line for a first time to generate first image data (S120). In an embodiment, the first pixel may be a low-illuminance pixel having a first conversion gain.

Also, the image sensor may expose at least one second pixel connected to the selected row line for a second time to generate second image data (S130). In an embodiment, the second pixel may be a high-illuminance pixel having a second conversion gain, lower than the first conversion gain. The high-illuminance pixel may have the same size and characteristics as the low-illuminance pixel, except that the high-illuminance pixel further includes an expansion capacitor connected to a floating diffusion. For example, an area of a light receiving region of the high-illuminance pixel may be the same as an area of a light receiving region of the low-illuminance pixel.

An image signal processor ISP may merge the first image data obtained from the first pixel and the second image data obtained from the second pixel to generate an object image (S140).

Hereinafter, the operation method of FIG. 21 will be described in detail with reference to FIG. 22.

Figure 22:
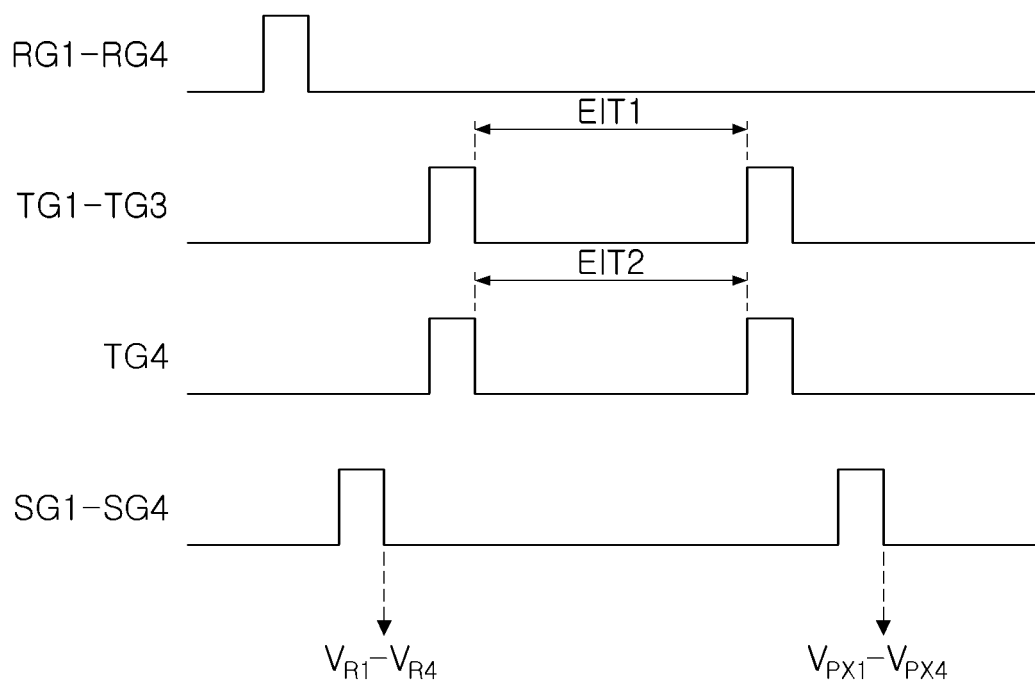
FIG. 22 illustrates a waveform diagram of the operation method of FIG. 21.

FIG. 22 illustrates a waveform diagram of the operation method of FIG. 21, which operation is in the HDR mode. In FIG. 22 the horizontal axis represents time. In FIG. 22, it is assumed that an image sensor according to embodiments of the inventive concepts includes four pixel groups constituting an RGGB pattern or an RGBW pattern, and each of the pixel groups includes first to fourth pixels. As described above with reference to FIG. 4, first to third pixels may be low-illuminance pixels, and a fourth pixel may be a high-illuminance pixel further including an expansion capacitor.

Referring to FIG. 22, when a reset transistor (e.g., see FIGS. 5A and 5B) of each first to fourth pixels is turned on by reset control signals RG1 to RG4, a voltage of a floating diffusion region of each of the first to fourth pixels may be reset as a predetermined power supply voltage. After the voltage of the floating diffusion region of each of the first to fourth pixels is reset, when a select transistor of each of the first to fourth pixels is turned on by selection control signals SG1 to SG4, first to fourth reset voltages $V_{R1}$ to $V_{R4}$ of each of the first to fourth pixels may be output to a column line COL through a pixel node PN.

After the reset voltages $V_{R1}$ to $V_{R4}$ of each of the first to fourth pixels are output to the column line COL, when a transfer transistor of each of the first to fourth pixels is turned on by transfer control signals TG1 to TG4, a charge generated by a photodiode of each of the first to third pixels, which may be low-illuminance pixels, and a charge generated by a photodiode of the fourth pixel, which may be a high-illuminance pixel, may respectively move to floating diffusion regions FD. In an embodiment, first exposure time EIT1 of each of the first to third pixels may be equal to or longer than second exposure time EIT2 of the fourth pixel.

In a normal mode automatically controlling exposure time, an image sensor may sequentially expose the first to fourth pixels to acquire a plurality of image data.

When the select transistor of each of the first to fourth pixels is turned on by the selection control signals SG1 to SG4, first to third pixel signals $V_{PX1}$ to $V_{PX3}$ generated by the first to third pixels and fourth pixel signal $V_{PX4}$ generated by the fourth pixel may be output to a column line COL through a pixel node PN, respectively.

The image sensor may generate the image data, based on comparison results of the reset voltages $V_{R1}$ to $V_{R4}$ and the pixel signals $V_{PX1}$ to $V_{PX4}$. In an embodiment, the image sensor may merge and generate first to third pixel signals as a single pixel signal by using an analog binning technique such as floating diffusion sharing or the like, and may generate low-illuminance image data from the merged and generated pixel signals. In addition, in an embodiment, the image sensor may convert first to third pixel signals into digital signals, and may use a digital binning technique applying a predetermined weight to the converted digital signals and summing the weighted digital signals, to generate low-illuminance image data.

The image sensor may merge high-illuminance image data with the low-illuminance image data generated in this way to generate a final object image.

Figure 23:
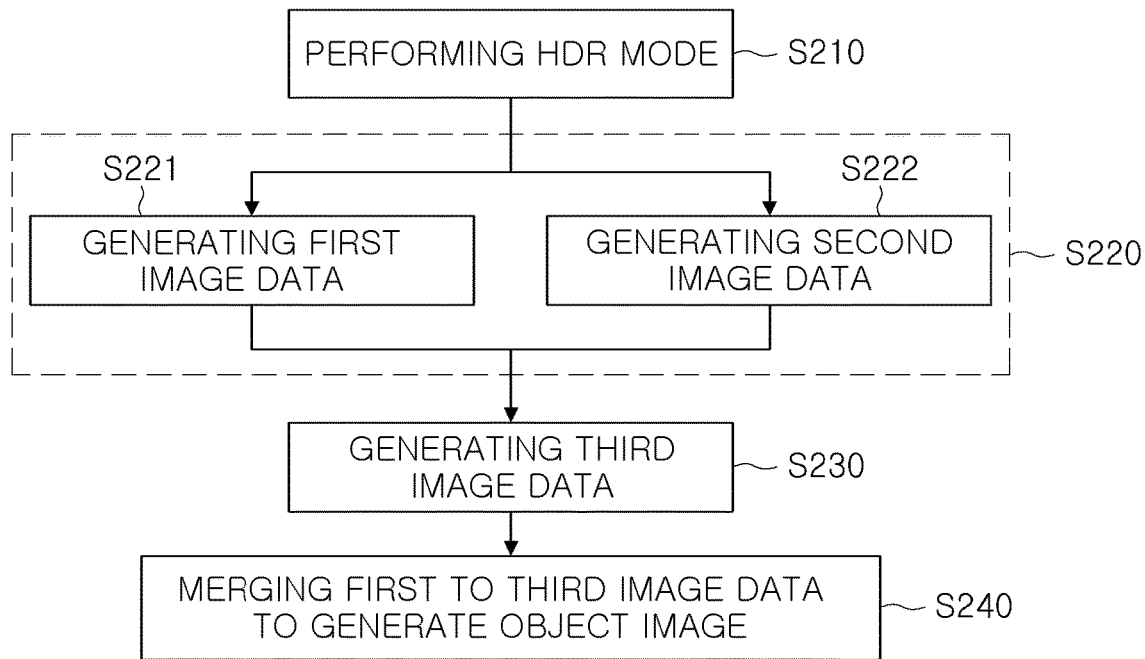
FIG. 23 illustrates a flowchart of an operation method of an imaging device according to embodiments of the inventive concepts.

FIG. 23 illustrates a flowchart of an operation method of an imaging device according to embodiments of the inventive concepts.

Referring to FIG. 23, an imaging device may perform a high dynamic range (HDR) mode, based on a user input or an illumination environment (S210).

In the HDR mode, an image sensor may select any one of a plurality of row lines, and may expose at least one first pixel connected to the selected row line for first time to generate first image data (S221). In an embodiment, the first pixel may be a low-illuminance pixel having a first conversion gain.

Also, the image sensor may expose at least one second pixel connected to the selected row line for second time, which may be less than or equal to the first time, to generate second image data (S222). In an embodiment, the second pixel may be a high-illuminance pixel having a second conversion gain, lower than the first conversion gain.

Different from the operation method of FIG. 21, which may merge only the first image data and the second image data to generate an object image, the image sensor may sequentially expose all pixels included in the image sensor to additionally generate third image data (S230). In an embodiment, exposure time of each of the pixels for generating the third image data may be the same.

Thereafter, the image sensor may merge the first to third image data to generate an object image (S240). Different from the operation method of FIG. 21, which may merge only high-illuminance image data and low-illuminance image data to generate an object image, since the image sensor may additionally merge third image data acquired in the same manner as a normal mode (that is by sequential exposure), to generate a final object image, resolution may be further improved.

Hereinafter, the operation method of FIG. 23 will be described in detail with reference to FIG. 24.

Figure 24:
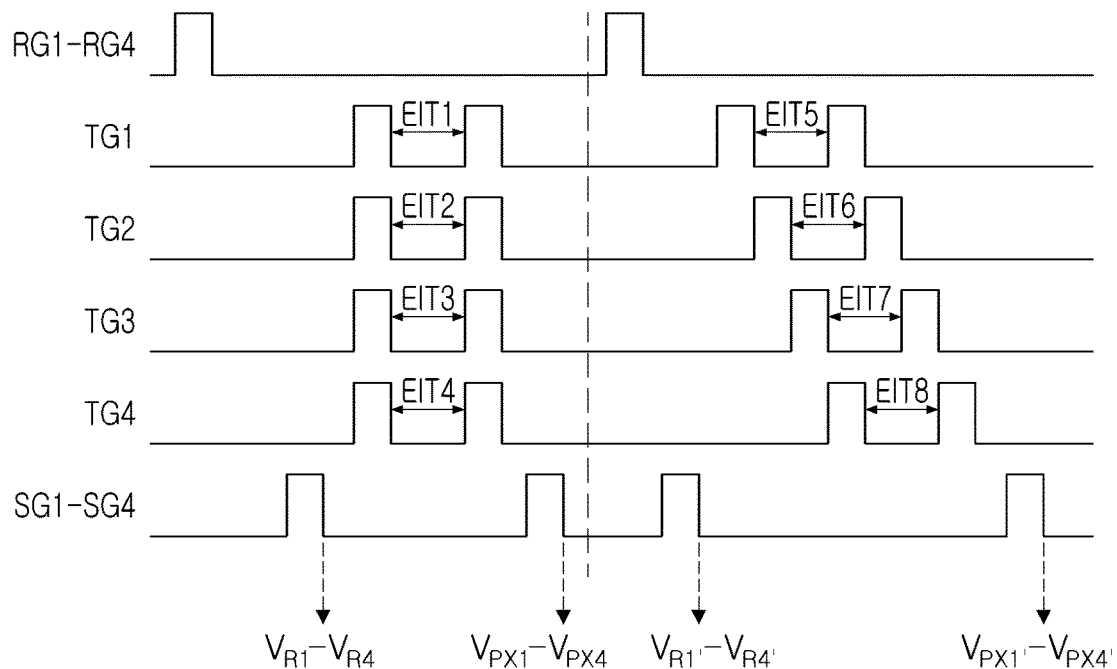
FIG. 24 illustrates a waveform diagram of the operation method of FIG. 23.

FIG. 24 illustrates a waveform diagram of the operation method of FIG. 23, which operation is in the HDR mode. In FIG. 24 the horizontal axis represents time. In FIG. 24, it is assumed that an image sensor according to embodiments of the inventive concepts includes four pixel groups constituting an RGGB pattern or an RGGW pattern, and each pixel group includes first to fourth pixels. As described above with reference to FIG. 4, first to third pixels may be low-illuminance pixels, and a fourth pixel may be a high-illuminance pixel further including an expansion capacitor.

Referring to FIG. 24, when a reset transistor (e.g., see FIGS. 5A and 5B) of each first to fourth pixels is turned on by reset control signals RG1 to RG4, a voltage of a floating diffusion region may be reset as a predetermined power supply voltage. After the voltage of the floating diffusion region is reset, when a select transistor of each of the first to fourth pixels is turned on by selection control signals SG1 to SG4, first to fourth reset voltages $V_{R1}$ to $V_{R4}$ of each of the first to fourth pixels may be output to a column line COL through a pixel node PN.

After the reset voltages $V_{R1}$ to $V_{R4}$ of each of the first to fourth pixels are output to the column line COL, when a transfer transistor of each of the first to fourth pixels is turned on by transfer control signals TG1 to TG4, a charge generated by a photodiode of each of the first to third pixels, which may be low-illuminance pixels, and a charge generated by a photodiode of the fourth pixel, which may be a high-illuminance pixel, may respectively move to floating diffusion regions FD. In an embodiment, exposure time EIT1 to EIT3 of each of the first to third pixels may be equal to or longer than exposure time EIT4 of the fourth pixel.

When the select transistor of each of the first to fourth pixels is turned on by the selection control signals SG1 to SG4, first to third pixel signals $V_{PX1}$ to $V_{PX3}$ generated by the first to third pixels and fourth pixel signal $V_{PX4}$ generated by the fourth pixel may be output to a column line COL through a pixel node PN, respectively.

The image sensor may generate image data, based on comparison results of the reset voltages $V_{R1}$ to $V_{R4}$ and the pixel signals $V_{PX1}$ to $V_{PX4}$. The image sensor may generate first image data from the first to third pixel signals $V_{PX1}$ to $V_{PX3}$ by applying an analog binning technique or a digital binning technique. In an embodiment, the first image data may be low-illuminance image data. Also, the image sensor may generate second image data from the fourth pixel signal $V_{PX4}$. In an embodiment, the second image data may be high illumination image data.

The reset transistor of each of the first to fourth pixels may thereafter be turned on by the reset control signal RG1 to RG4, to reset the voltage of the floating diffusion back to a power supply voltage, and reset voltages $V_{R1'}$ to $V_{R4'}$ of each of the first to fourth pixels may be output by the first to fourth selection control signals SG1 to SG4 to the column line COL through the pixel node PN.

After the reset voltages $V_{R1'}$ to $V_{R4'}$ are output to the column line COL, when the transfer transistors of each of the first to fourth pixels are sequentially turned on by the transfer control signals TG1 to TG4, the charge generated by the photodiode of each of the first to fourth pixels may respectively move to floating diffusions. Exposure time EIT5 to EIT7 of each of the first to third pixels, which may be low-illuminance pixels, may be equal to or longer than exposure time EIT8 of the fourth pixel, which may be a high-illuminance pixel. Although FIG. 24 illustrates that the first to fourth pixels are sequentially exposed, in other embodiments for example the first to fourth pixels may be exposed in reverse order.

When the select transistors of each of the first to fourth pixels are turned on by the selection control signals SG1 to SG4, the first to fourth pixel signals $V_{PX1'}$ to $V_{PX4'}$ generated by the first to fourth pixels may be output to a column line through a pixel node, respectively.

The image sensor may generate third image data, based on comparison results of the reset voltages $V_{R1'}$ to $V_{R4'}$ and the pixel signals $V_{PX1'}$ to $V_{PX4'}$. The image sensor may generate third image data from the first to fourth pixel signals $V_{PX1'}$ to $V_{PX4'}$ by applying an analog binning technique or a digital binning technique.

Thereafter, the image sensor may merge the first to third image data to generate a final object image.

Figure 25:
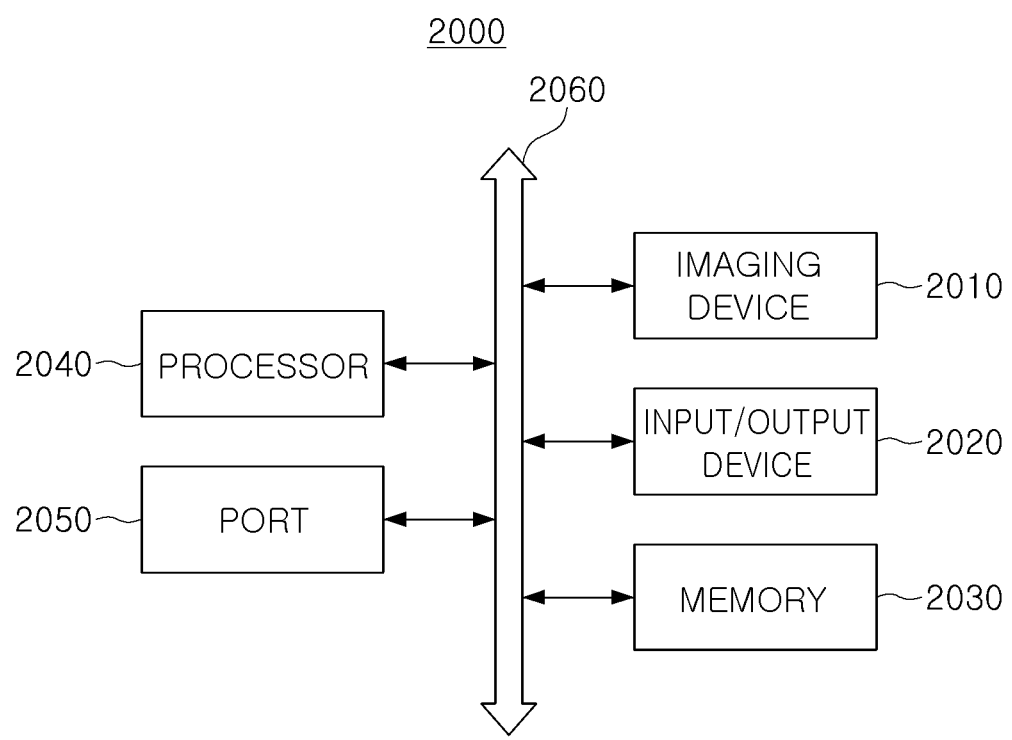
FIG. 25 illustrates a block diagram of an electronic device including an imaging device according to embodiments of the inventive concepts.

FIG. 25 illustrates a block diagram of an electronic device including an imaging device according to embodiments of the inventive concepts.

Referring to FIG. 25, an electronic device 2000 may include an imaging device 2010, an input/output device 2020, a memory 2030, a processor 2040, and a port 2050. For example, the electronic device 2000 may be a smartphone, a tablet PC, a smart wearable device, or the like.

The imaging device 2010 may include the image sensors described with reference to FIGS. 1 to 24, and may be connected to the processor 2040 through a bus 2060 or other communications means.

The input/output device 2020 may include input devices such as for example a keyboard, a mouse, a touch screen, or the like provided to a user, and output devices such as for example a display, an audio output unit, or the like.

The memory 2030 may be storage medium for storing data, or multimedia data for operating the electronic device

2000. The memory 2030 may include volatile memory, or nonvolatile memory such as flash memory or the like. Also, the memory 2030 may include at least one of solid state drive (SSD), hard disk drive (HDD), and optical drive (ODD) as a storage unit.

The processor 2040 may perform specific operations, commands, tasks, or the like. The processor 2040 may be a central processing unit (CPU) or a microprocessor unit (MCU), a system-on-chip (SoC), or the like, and may communicate with the imaging device 2010, the input/output device 2020, and the memory 2030, as well as other devices connected to the port 2050, through the bus 2060.

The image sensor according to embodiments of the inventive concepts may prevent blurring of an object image that may occur when the exposure time may be different by controlling the exposure time of the low-illuminance pixel and the high-illuminance pixel to be the same.

In addition, the image sensor according to the embodiments of the inventive concepts may prevent the occurrence of a dark current by acquiring an object image using a low-illuminance pixel and a high-illuminance pixel having the same size and characteristics.

While example embodiments have been illustrated and described above, it should be apparent to those skilled in the art that modifications and variations may be made without departing from the scope of the inventive concepts as defined by the appended claims.

What is claimed is:

1. An imaging device comprising:
   a pixel array connected to a plurality of row lines and a plurality of column lines, and including a plurality of first pixels having a first conversion gain and a plurality of second pixels having a second conversion gain lower than the first conversion gain;
   a row driver configured to determine a selection row line from among the plurality of row lines;
   a readout circuit configured to respectively obtain a first pixel signal and a second pixel signal from first pixels and second pixels connected to the selection row line;
   a column driver configured to generate first image data from the first pixel signal and second image data from the second pixel signal; and
   an image signal processor configured to generate an object image from the first image data and the second image data,
   wherein each of the second pixels includes a floating diffusion node, a ground node, and an expansion capacitor connected between the floating diffusion node and the ground node,
   the row driver is configured to set exposure time of the first pixels to be equal to or longer than exposure time of the second pixels,
   an area of a light receiving region of each of the first pixels is equal to an area of a light receiving region of each of the second pixels,
   the pixel array comprises a plurality of pixel groups respectively including two or more first pixels from among the plurality of first pixels, and one or more second pixels from among the plurality of second pixels, and the plurality of pixel groups have a predetermined color pattern, and
   each of the plurality of pixel groups a number of the first pixels is greater than a number of the second pixels.

2. The imaging device of claim 1, wherein in each of the plurality of pixel groups, each of the second pixels are disposed closer to a center of a pixel group than the first pixels.

3. The imaging device of claim 1, wherein the first pixel signal corresponds to a total amount of charges generated by the first pixels connected to the selection row line.

4. The imaging device of claim 1, wherein the readout circuit is configured to obtain the first pixel signal by converting pixel signals generated by the first pixels connected to the selection row line into digital signals, applying a predetermined weight to the digital signals, and summing the weighted digital signals.

5. The imaging device of claim 1, wherein in an environment in which external illumination is low, the readout circuit is configured to interpolate the first pixel signal to obtain the second pixel signal.

6. The imaging device of claim 1, wherein capacitance of the expansion capacitor is 1 fF or more and less than 1 pF.

7. An imaging device comprising:
   a pixel array including a plurality of color pixel groups, wherein each of the plurality of color pixel groups including a plurality of first pixels and at least one second pixel;
   an image data generator configured to expose the plurality of first pixels during a first exposure time to generate first image data, expose the at least one second pixel during the first exposure time to generate second image data, and sequentially expose the plurality of first pixels and the at least one second pixel during a second exposure time to generate third image data; and
   an image signal processor configured to merge the first image data, the second image data, and the third image data, to generate an object image,
   wherein the image data generator is configured to generate the first image data by summing pixel signals obtained from the plurality of first pixels.

8. The imaging device of claim 7, wherein conversion gain of the plurality of first pixels is greater than conversion gain of the at least one second pixel.

9. The imaging device of claim 7, wherein the plurality of first pixels share at least one floating diffusion node.

10. The imaging device of claim 7, wherein the image data generator is configured to convert the pixel signals obtained by the plurality of first pixels into digital signals, apply a predetermined weight to the digital signals, and sum the weighted digital signals to generate the first image data.

11. The imaging device of claim 7, wherein the plurality of color pixel groups has an N×M matrix structure, wherein N and M are positive integers.

12. The imaging device of claim 11, wherein in each of the plurality of color pixel groups the at least one second pixel is disposed closer to a center of a color pixel group than the first pixels.

13. The imaging device of claim 12, wherein an area of a light receiving region of each of the plurality of first pixels is equal to an area of a light receiving region of the at least one second pixel.

14. An image sensor comprising:
   a plurality of first pixels including a first floating diffusion region disposed in a substrate and a plurality of first photodiodes connected to the first floating diffusion region;
   at least one second pixel including a second floating diffusion region disposed in the substrate and at least one second photodiode connected to the second floating diffusion region, the second floating diffusion region is disposed adjacent to the first pixels in a direction parallel to an upper surface of the substrate; and an expansion capacitor disposed in the substrate and connected to the second floating diffusion region through a metal line, wherein the expansion capacitor has a region overlapping at least one first pixel among the plurality of first pixels in a direction perpendicular to the upper surface of the substrate.

15. The image sensor of claim 14, wherein the plurality of first pixels are arranged to surround the at least one second pixel.

16. The image sensor of claim 14, wherein a width of each of the plurality of first pixels is equal to a width of the at least one second pixel in the direction parallel to the upper surface of the substrate.

17. The image sensor of claim 14, wherein the expansion capacitor is a metal-insulator-metal (MIM) capacitor.

18. The image sensor of claim 14, wherein the expansion capacitor is a poly-insulator-poly (PIP) capacitor.

* * * * *